(12) United States Patent
Machida

(10) Patent No.: US 12,041,368 B2
(45) Date of Patent: Jul. 16, 2024

(54) IMAGING DEVICE

(71) Applicant: SONY SEMICONDUCTOR SOLUTIONS CORPORATION, Kanagawa (JP)

(72) Inventor: Taskashi Machida, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 583 days.

(21) Appl. No.: 17/267,117

(22) PCT Filed: Aug. 19, 2019

(86) PCT No.: PCT/JP2019/032266
§ 371 (c)(1),
(2) Date: Feb. 9, 2021

(87) PCT Pub. No.: WO2020/045142
PCT Pub. Date: Mar. 5, 2020

(65) Prior Publication Data
US 2021/0203873 A1 Jul. 1, 2021

(30) Foreign Application Priority Data
Aug. 30, 2018 (JP) ................................ 2018-161752

(51) Int. Cl.
*H04N 25/77* (2023.01)
*H01L 27/146* (2006.01)
*H04N 25/74* (2023.01)

(52) U.S. Cl.
CPC ....... *H04N 25/77* (2023.01); *H01L 27/14609* (2013.01); *H01L 27/14643* (2013.01); *H04N 25/74* (2023.01)

(58) Field of Classification Search
CPC ...... H04N 25/77; H04N 25/74; H04N 25/771; H01L 27/14609; H01L 27/14614; H01L 27/03; H01L 27/64; H01L 27/14643
See application file for complete search history.

(56) References Cited

U.S. PATENT DOCUMENTS 9,129,881 B2 * 9/2015 Kawamura ....... H01L 27/14683
9,935,142 B2 * 4/2018 Hwangbo ......... H01L 27/14645
250/208.1
(Continued)

FOREIGN PATENT DOCUMENTS

| CN | 103959467 A | 7/2014 |
|---|---|---|
| CN | 104425535 A | 3/2015 |

(Continued)

OTHER PUBLICATIONS

International Search Report prepared by the Japan Patent Office dated Nov. 7, 2019, for International Application No. PCT/JP2019/032266.

*Primary Examiner* — Marly S Camargo
(74) *Attorney, Agent, or Firm* — Sheridan Ross PC

(57) ABSTRACT

An imaging device including a charge-holding section having a larger saturated charge amount is provided. The imaging device includes a first electrically-conductive type semiconductor substrate, a second electrically-conductive type photoelectric conversion section, a second electrically-conductive type charge-holding section, a transfer section, and a trench section. The semiconductor substrate includes a first surface and a second surface opposite thereto. The photoelectric conversion section, embedded in the semiconductor substrate, generates charges corresponding to a light reception amount by photoelectric conversion. The charge-holding section, embedded in the semiconductor substrate, holds the charges generated in the photoelectric conversion section. The transfer section transfers charges from the (Continued)

photoelectric conversion section to a transfer destination. The trench section extends in a thickness direction from the first surface toward the second surface in the charge-holding section. The trench section includes a first base and a first electrically-conductive type first semiconductor layer provided to cover the first base.

16 Claims, 39 Drawing Sheets

(56) References Cited

U.S. PATENT DOCUMENTS

| | | | |
|---|---|---|---|
| 11,450,696 B1* | 9/2022 | Zang | H04N 25/15 |
| 11,482,550 B2* | 10/2022 | Machida | H04N 25/50 |
| 11,699,713 B2* | 7/2023 | Yang | H01L 27/14698 |
| 11,877,071 B1* | 1/2024 | Orlowski | H04N 25/77 |
| 2012/0217558 A1 | 8/2012 | Togashi | |
| 2014/0183685 A1 | 7/2014 | Roy et al. | |
| 2015/0069471 A1 | 3/2015 | Kawamura | |
| 2015/0236058 A1* | 8/2015 | Hu | H01L 27/14612 |
| 2016/0056199 A1 | 2/2016 | Kim et al. | |
| 2016/0155774 A1 | 6/2016 | Hasegawa et al. | |
| 2016/0218138 A1* | 7/2016 | Oishi | H01L 27/14607 |
| 2016/0268322 A1 | 9/2016 | Watanabe | |
| 2017/0200754 A1* | 7/2017 | Kawamura | H01L 27/14643 |
| 2018/0033809 A1 | 2/2018 | Tayanaka et al. | |
| 2019/0043901 A1 | 2/2019 | Honda et al. | |
| 2021/0400225 A1* | 12/2021 | Manda | H01L 27/1461 |
| 2022/0013554 A1* | 1/2022 | Mun | H01L 17/14641 |

FOREIGN PATENT DOCUMENTS

| | | |
|---|---|---|
| CN | 104662661 A | 5/2015 |
| JP | 2012-175067 | 9/2012 |
| JP | 2015-053411 | 3/2015 |
| JP | 2015-082592 | 4/2015 |
| JP | 2016-103541 | 6/2016 |
| JP | 2016103513 A | 6/2016 |
| JP | 2017-147353 | 8/2017 |
| WO | WO 2016/136486 | 9/2016 |
| WO | WO 2017/187957 | 11/2017 |

* cited by examiner

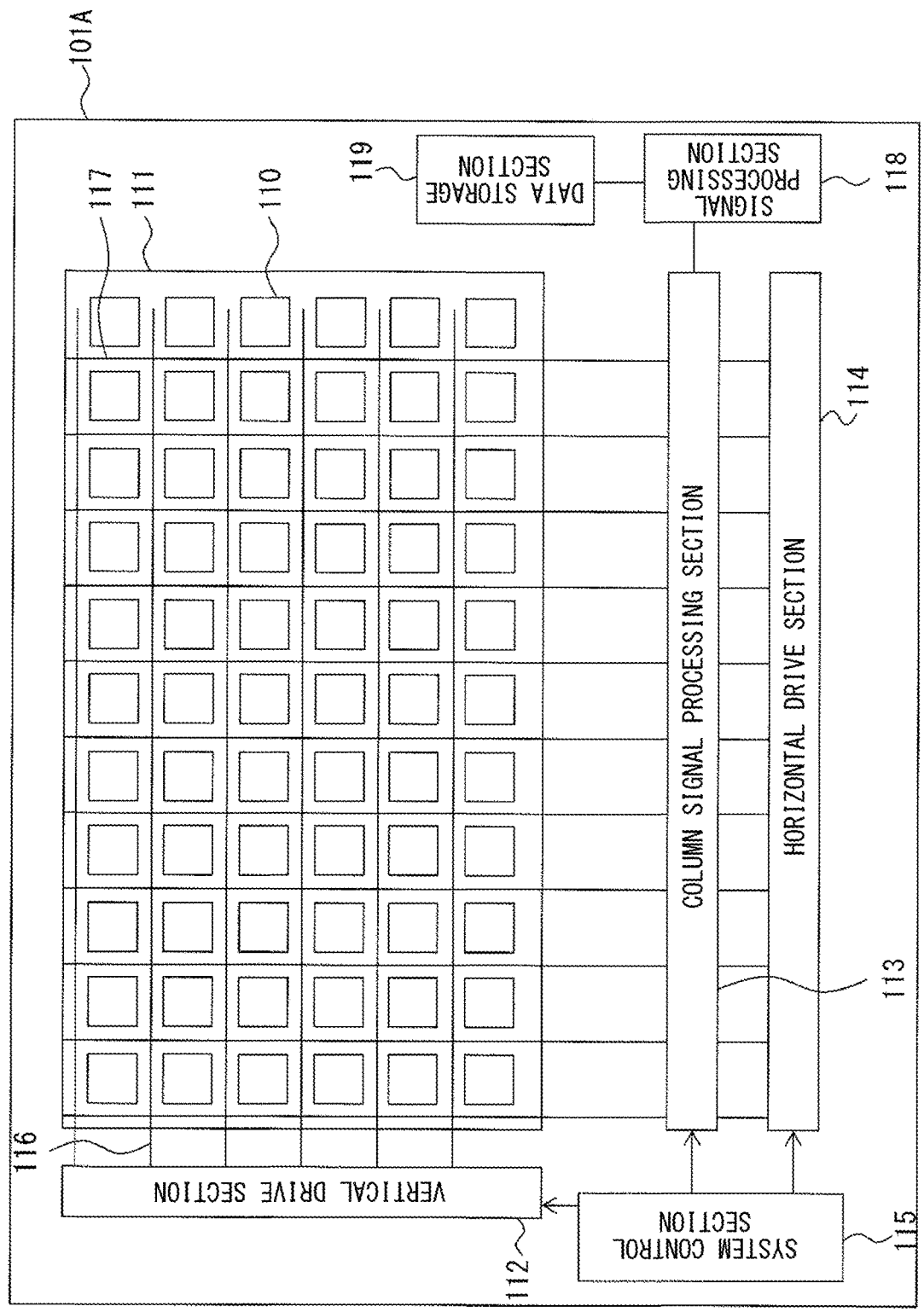

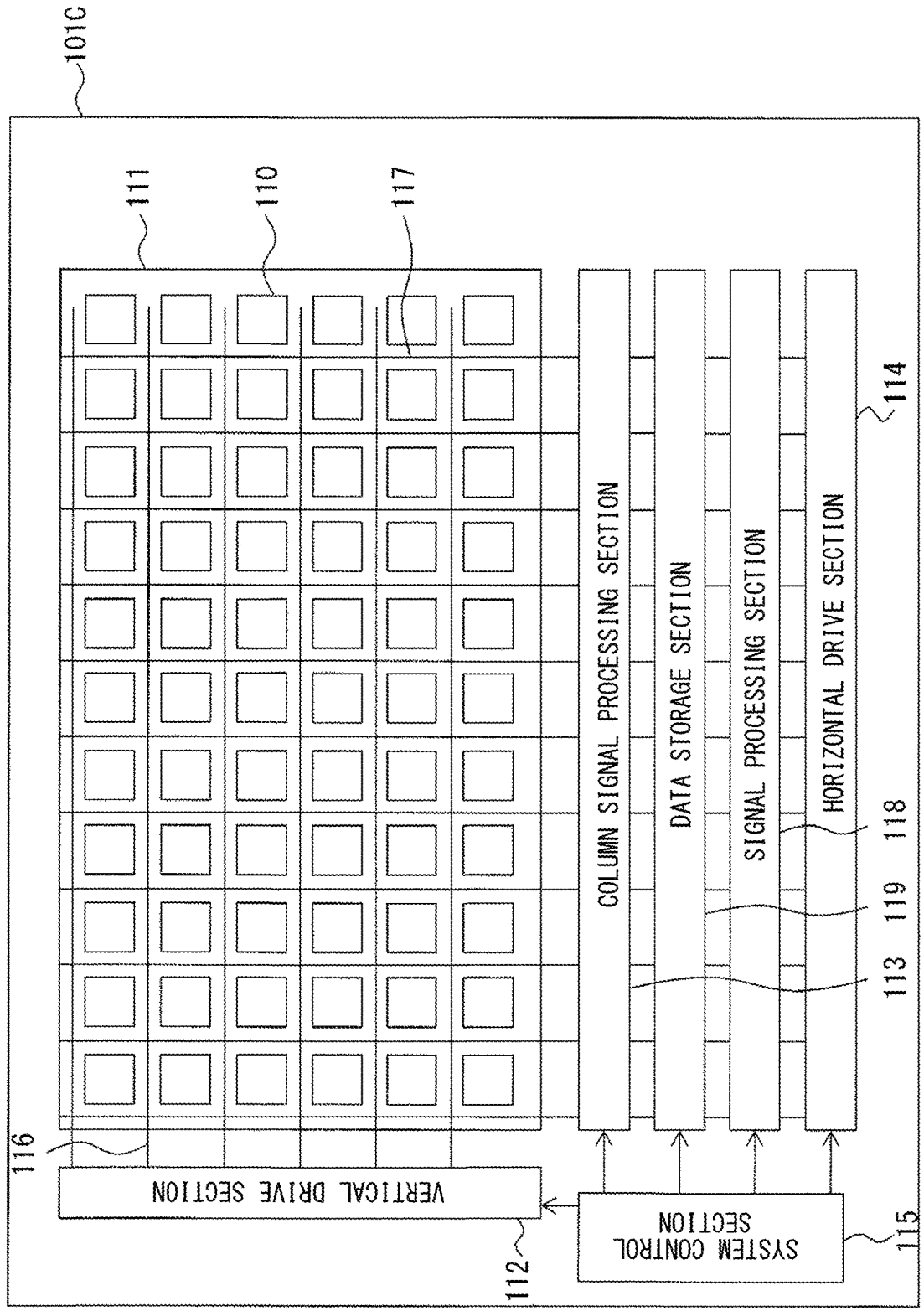

IMAGING DEVICE

CROSS REFERENCE TO RELATED APPLICATIONS

This application is a national stage application under 35 U.S.C. 371 and claims the benefit of PCT Application No. PCT/JP2019/032266 having an international filing date of 19 Aug. 2019, which designated the United States, which PCT application claimed the benefit of Japanese Patent Application No. 2018-161752, filed 30 Aug. 2018, the entire disclosures of each of which are incorporated herein by reference.

TECHNICAL FIELD

The present disclosure relates to an imaging device that captures an image by performing photoelectric conversion, and an electronic apparatus including the imaging device.

BACKGROUND ART

Heretofore, there has been proposed a solid-state imaging element that achieves a global shutter by providing a charge-holding section (a memory section) between a photoelectric conversion section and a floating diffusion (e.g., see PTL 1). The global shutter refers to a series of operations in which exposure is started simultaneously for all of pixels effective for imaging and thereafter the exposure is finished simultaneously.

CITATION LIST

Patent Literature

PTL 1: Japanese Unexamined Patent Application Publication No. 2015-53411

SUMMARY OF THE INVENTION

Incidentally, it is desirable for such a solid-state imaging element to have a larger saturated charge amount in the charge-holding section.

It is therefore desired to provide an imaging device including a charge-holding section that has a larger saturated charge amount, and an electronic apparatus including the imaging device.

An imaging device as an embodiment of the present disclosure includes a semiconductor substrate of a first electrically-conductive type, a photoelectric conversion section of a second electrically-conductive type, a charge-holding section of the second electrically-conductive type, a transfer section, and a trench section. The semiconductor substrate includes a first surface and a second surface on side opposite to the first surface. The photoelectric conversion section is embedded in the semiconductor substrate, and is configured to generate charges corresponding to an amount of light reception by means of photoelectric conversion. The charge-holding section is embedded in a semiconductor layer, and is configured to hold the charges generated in the photoelectric conversion section. The transfer section is configured to transfer the charges from the photoelectric conversion section to a transfer destination. The trench section extends in a thickness direction from the first surface toward the second surface in the charge-holding section. The trench section includes a first base and a first semiconductor layer of the first electrically-conductive type provided to cover the first base.

In addition, an electronic apparatus as an embodiment of the present disclosure includes the above-described imaging device.

In the imaging device and the electronic apparatus as respective embodiments of the present disclosure, the trench section including the first semiconductor layer that covers the first base extends in the thickness direction in the charge-holding section of the second electrically-conductive type. This configuration increases an area of a boundary part between the first electrically-conductive type semiconductor region and the second electrically-conductive type semiconductor region by an amount of a surface area of the trench section.

BRIEF DESCRIPTION OF THE DRAWINGS

FIG. 1A is a block diagram illustrating a configuration example of functions of an imaging device according to a first embodiment of the present disclosure.

FIG. 1C is a block diagram illustrating a configuration example of functions of an imaging device as a second modification example of the first embodiment.

Figure 4:
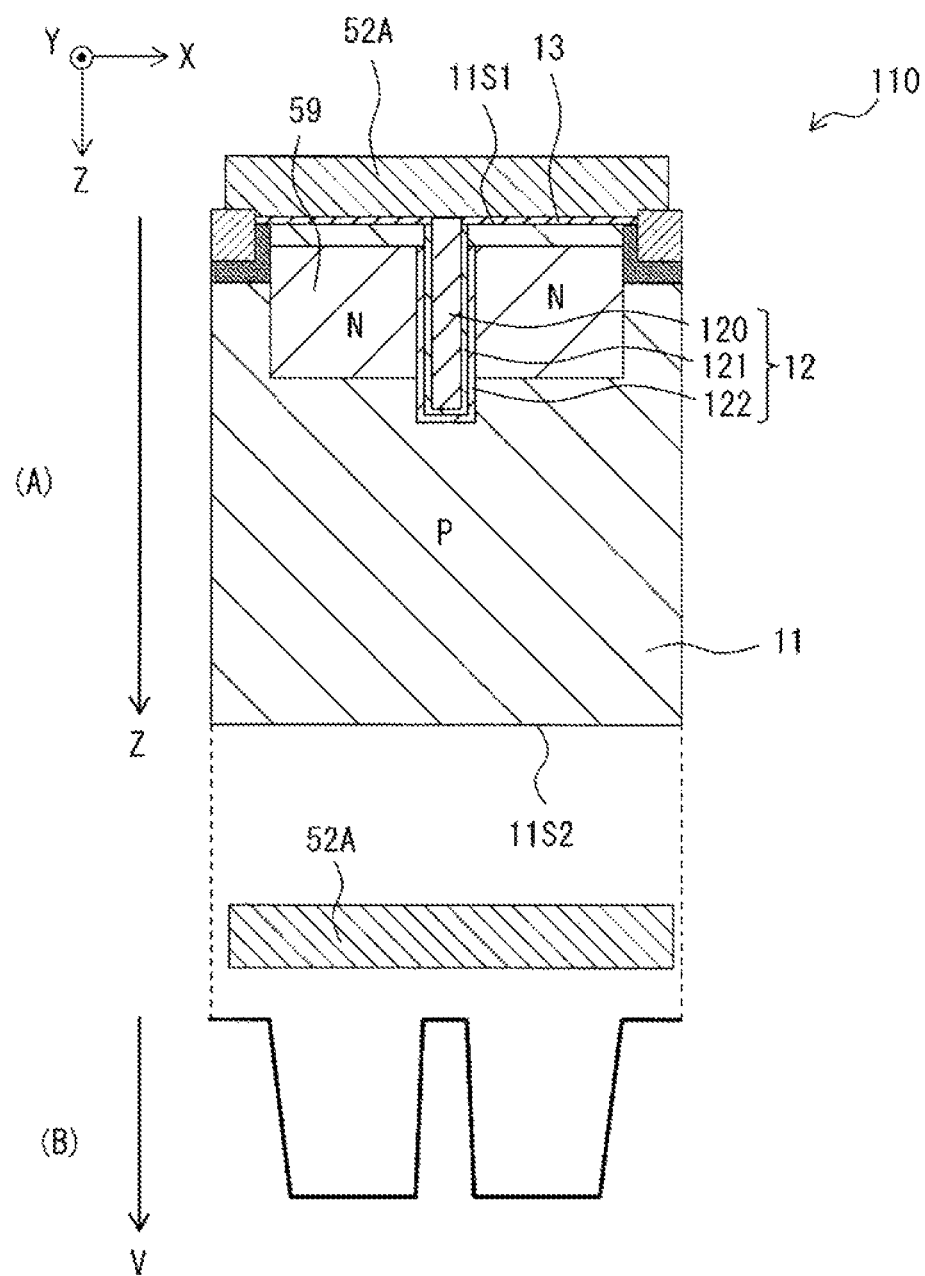

(A) of FIG. 4 is a first cross-sectional view schematically illustrating the configuration of a portion of the sensor pixel in the imaging device illustrated in FIG. 1A, and (B) of FIG. 4 is a schematic view of a potential state of the sensor pixel along the cross-section.

Figure 5:
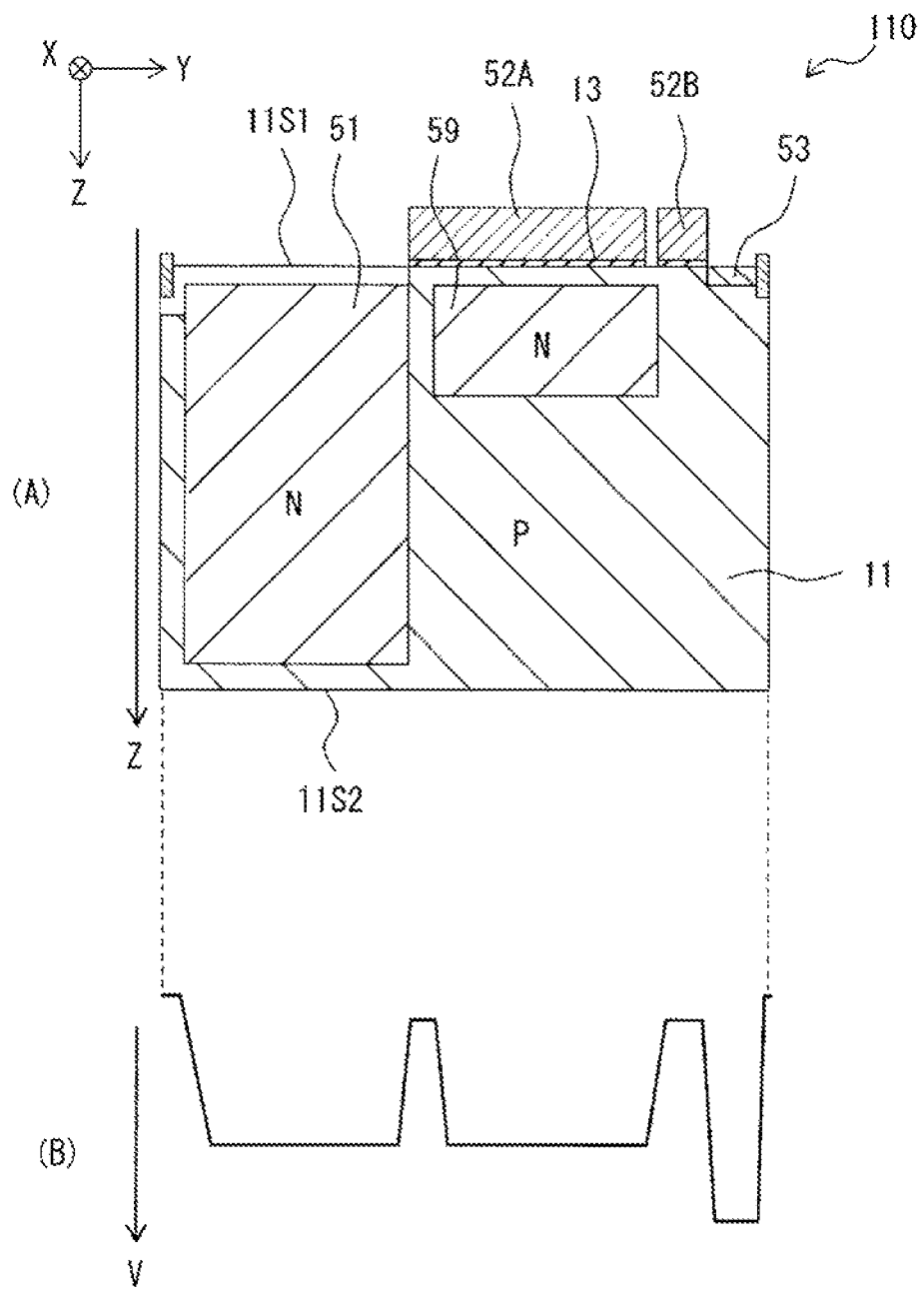

FIG. 5 is a second cross-sectional view schematically illustrating the configuration of a portion of the sensor pixel in the imaging device illustrated in FIG. 1A, and (B) of FIG. 5 is a schematic view of a potential state of the sensor pixel along the cross-section.

Figure 6:
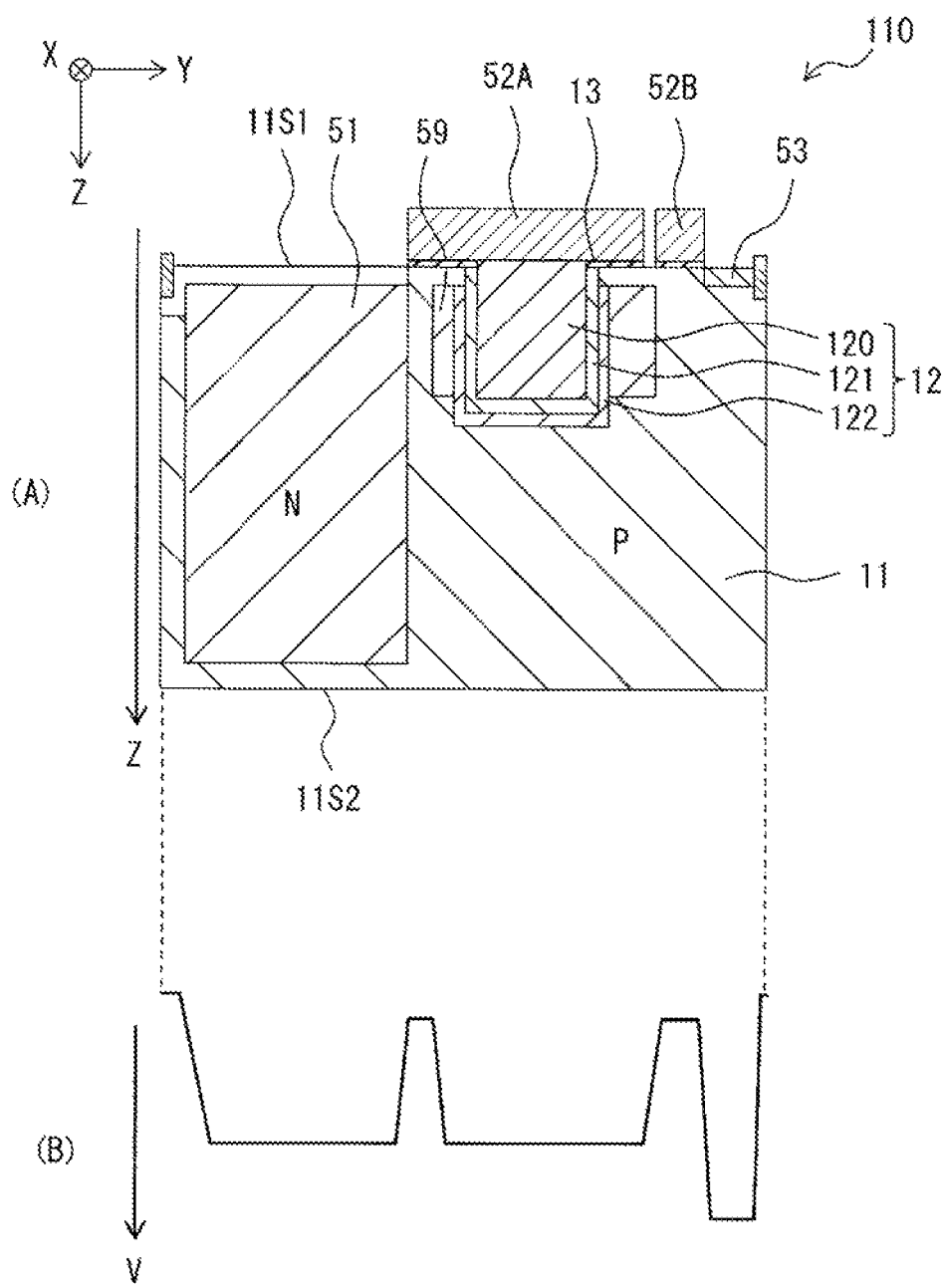

(A) of FIG. 6 is a third cross-sectional view schematically illustrating the configuration of a portion of the sensor pixel in the imaging device illustrated in FIG. 1A, and (B) of FIG. 6 is a schematic view of a potential state of the sensor pixel along the cross-section.

Figure 7A:
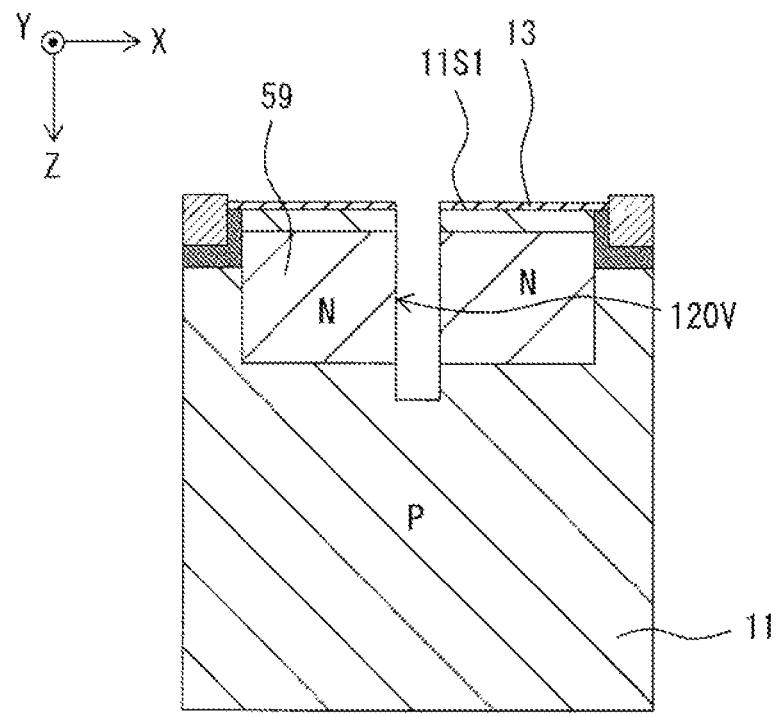

FIG. 7A is a cross-sectional view illustrating one step in a method of forming a main part of the imaging device illustrated in FIG. 1.

Figure 7B:
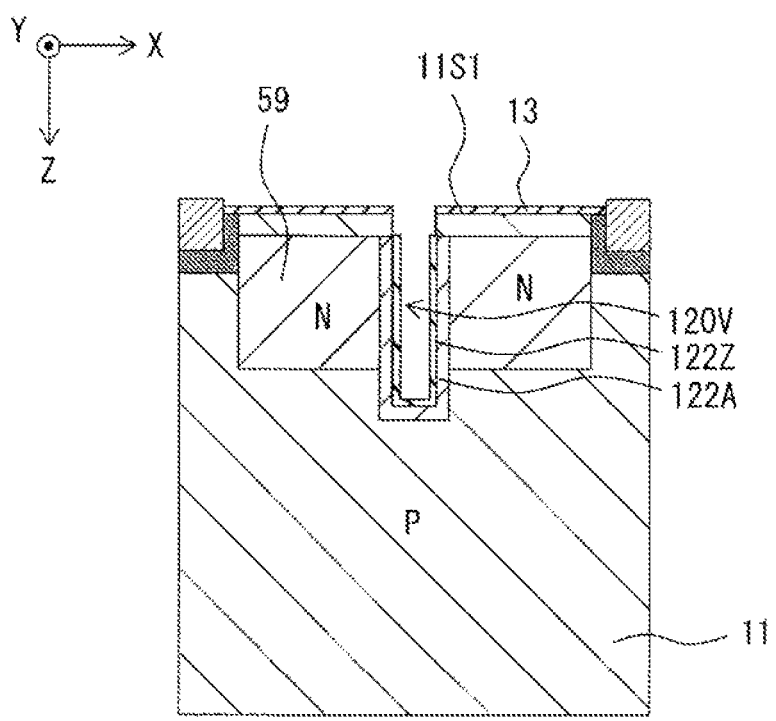

FIG. 7B is a cross-sectional view of one step subsequent to FIG. 7A.

Figure 7C:
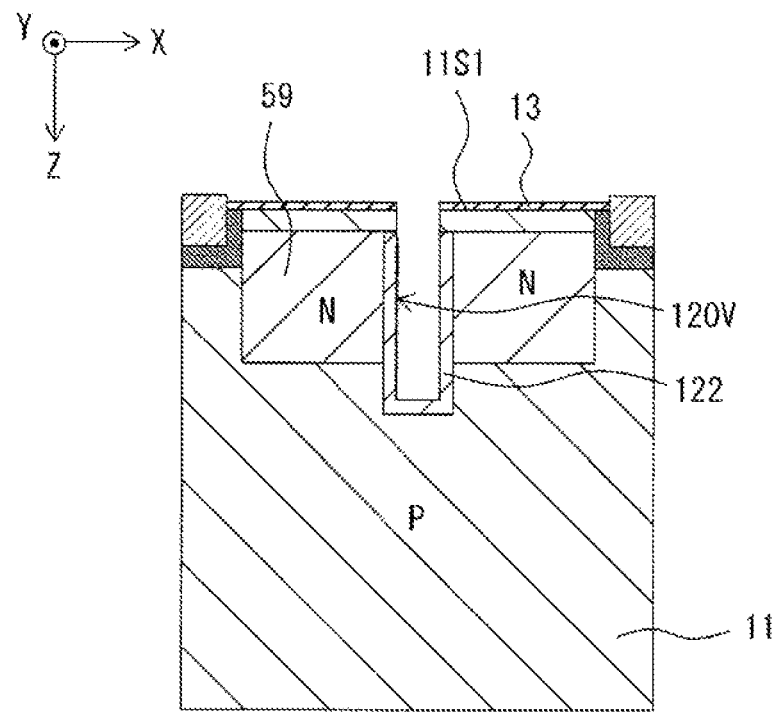

FIG. 7C is a cross-sectional view of one step subsequent to FIG. 7B.

Figure 7D:
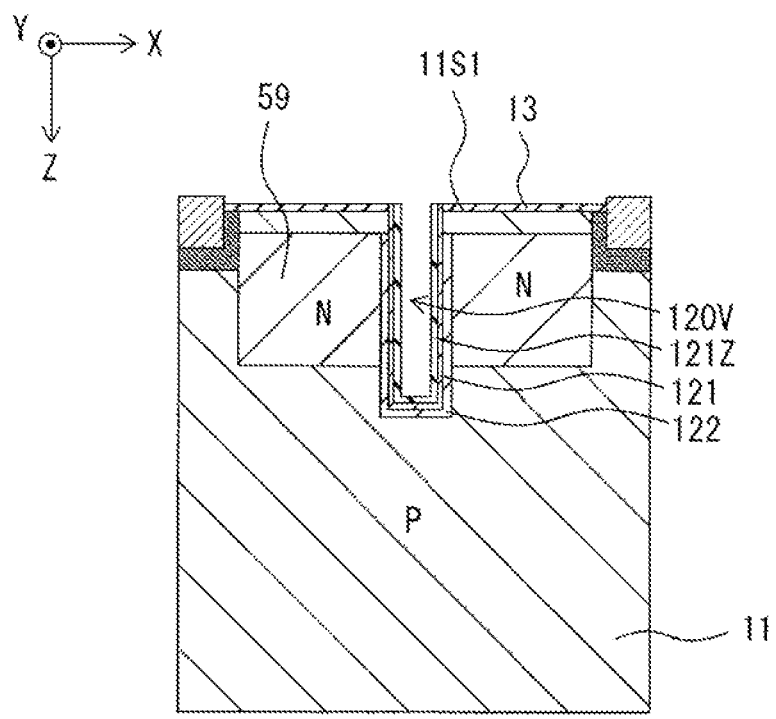

FIG. 7D is a cross-sectional view of one step subsequent to FIG. 7C.

Figure 7E:
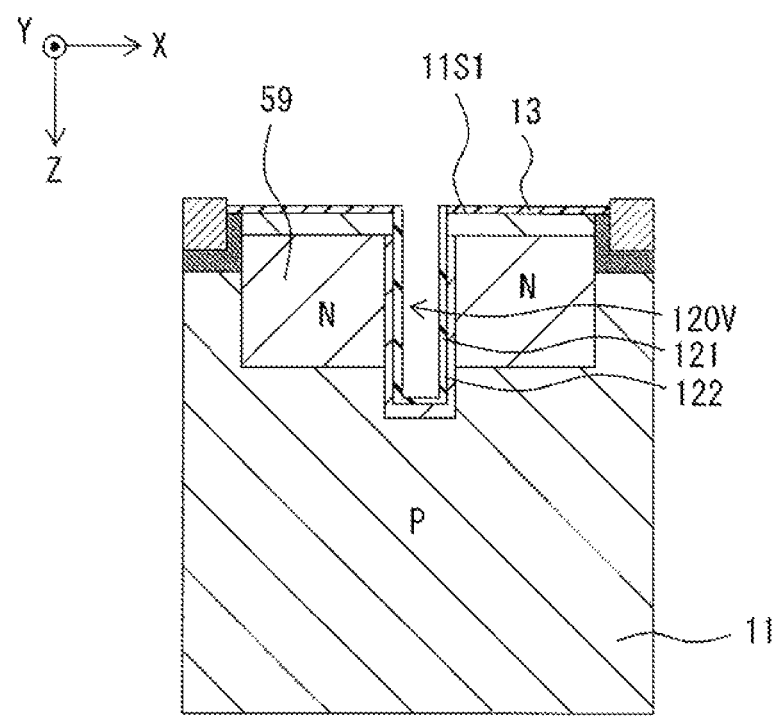

FIG. 7E is a cross-sectional view of one step subsequent to FIG. 7D.

Figure 8:
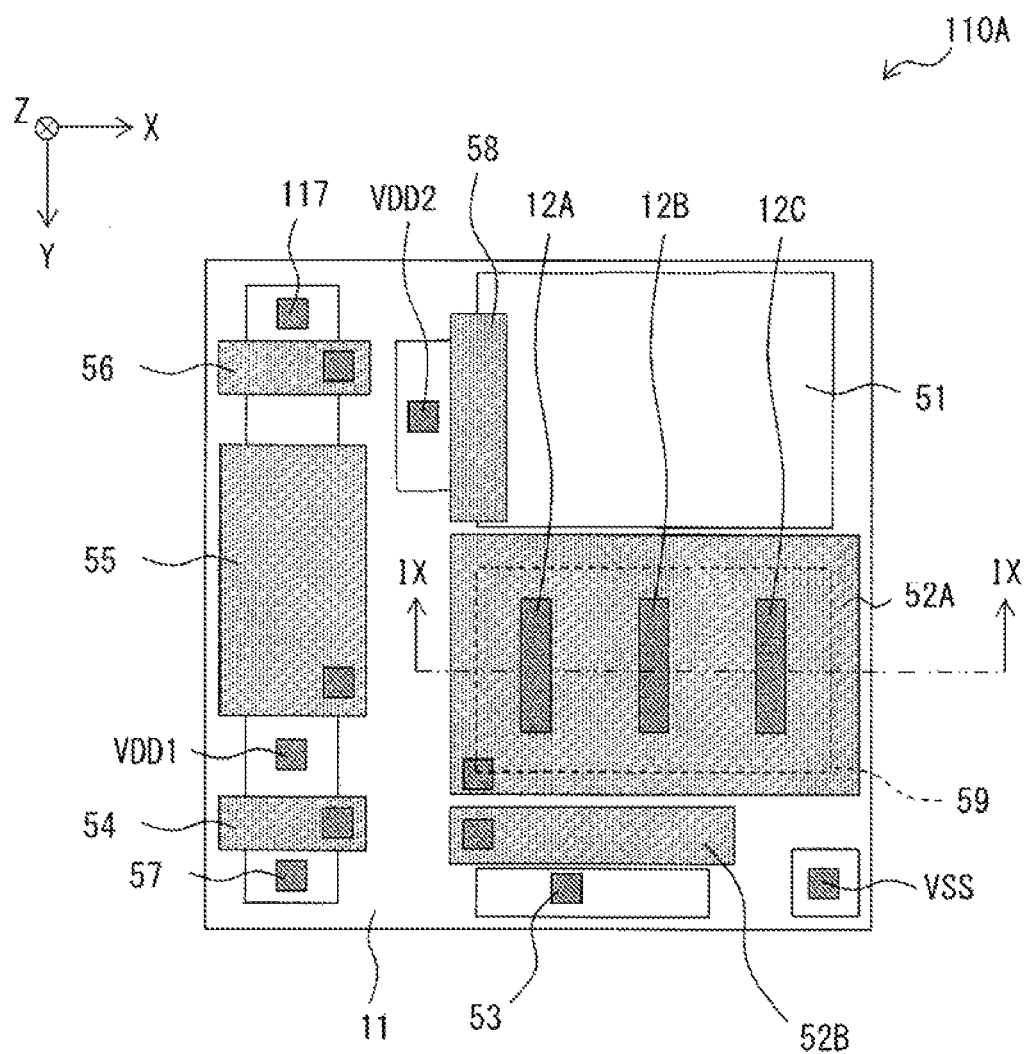

FIG. 8 is a plan view schematically illustrating a sensor pixel as a third modification example of the first embodiment.

Figure 9:
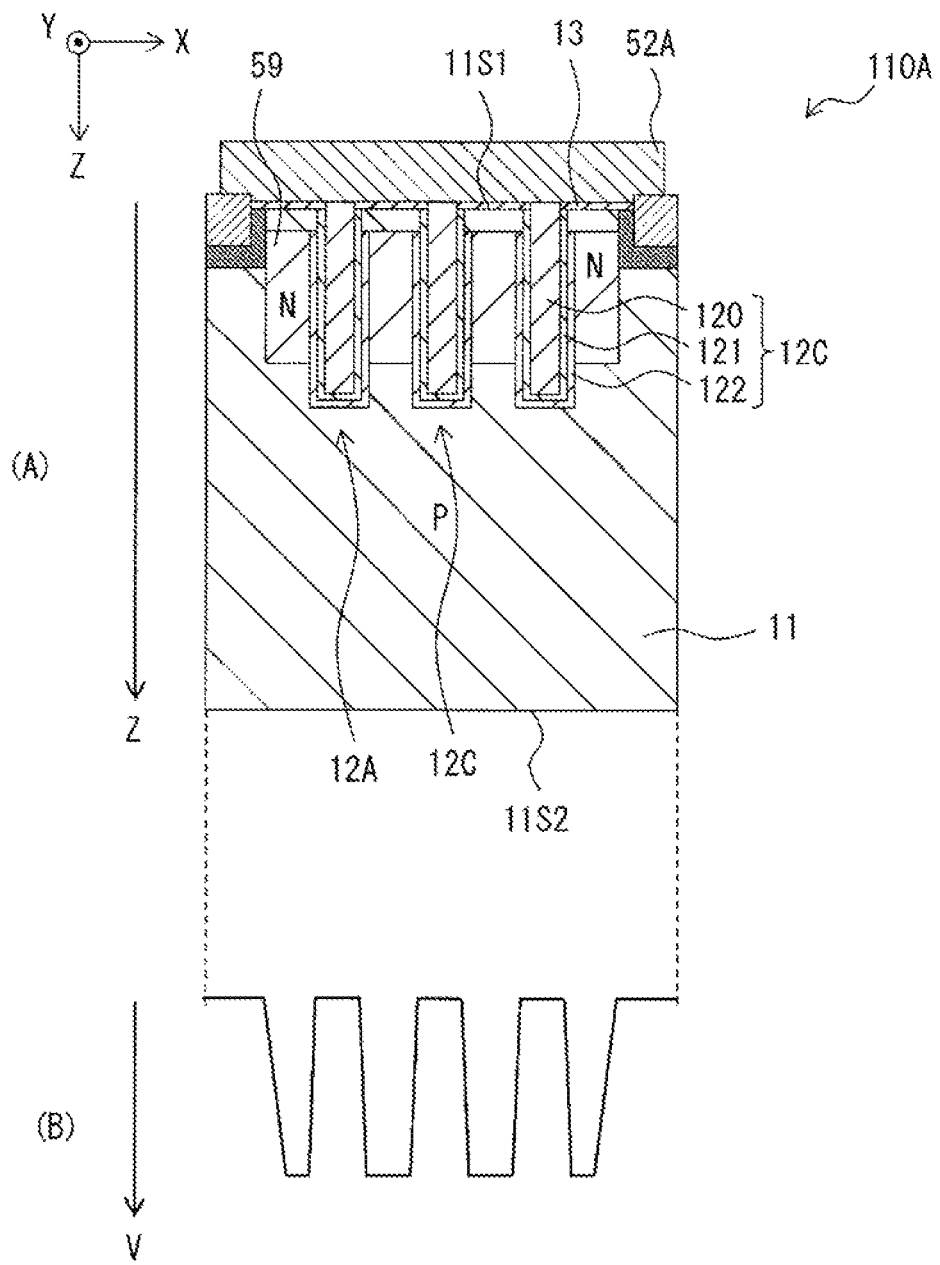

(A) of FIG. 9 is a cross-sectional view schematically illustrating the sensor pixel as the third modification example of the first embodiment, and (B) of FIG. 9 is a schematic view of a potential state of the sensor pixel along the cross-section.

Figure 10:
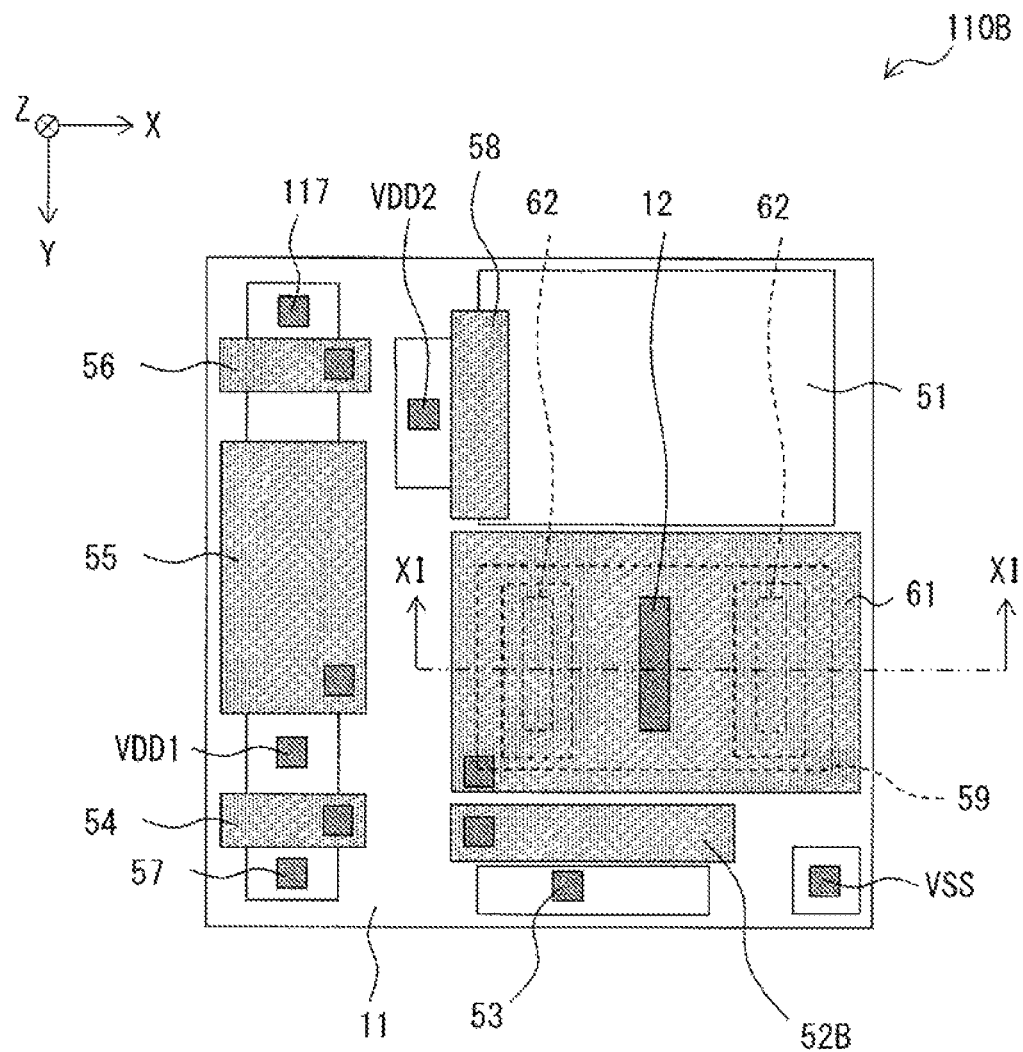

FIG. 10 is a plan view schematically illustrating a sensor pixel as a fourth modification example of the first embodiment.

Figure 11:
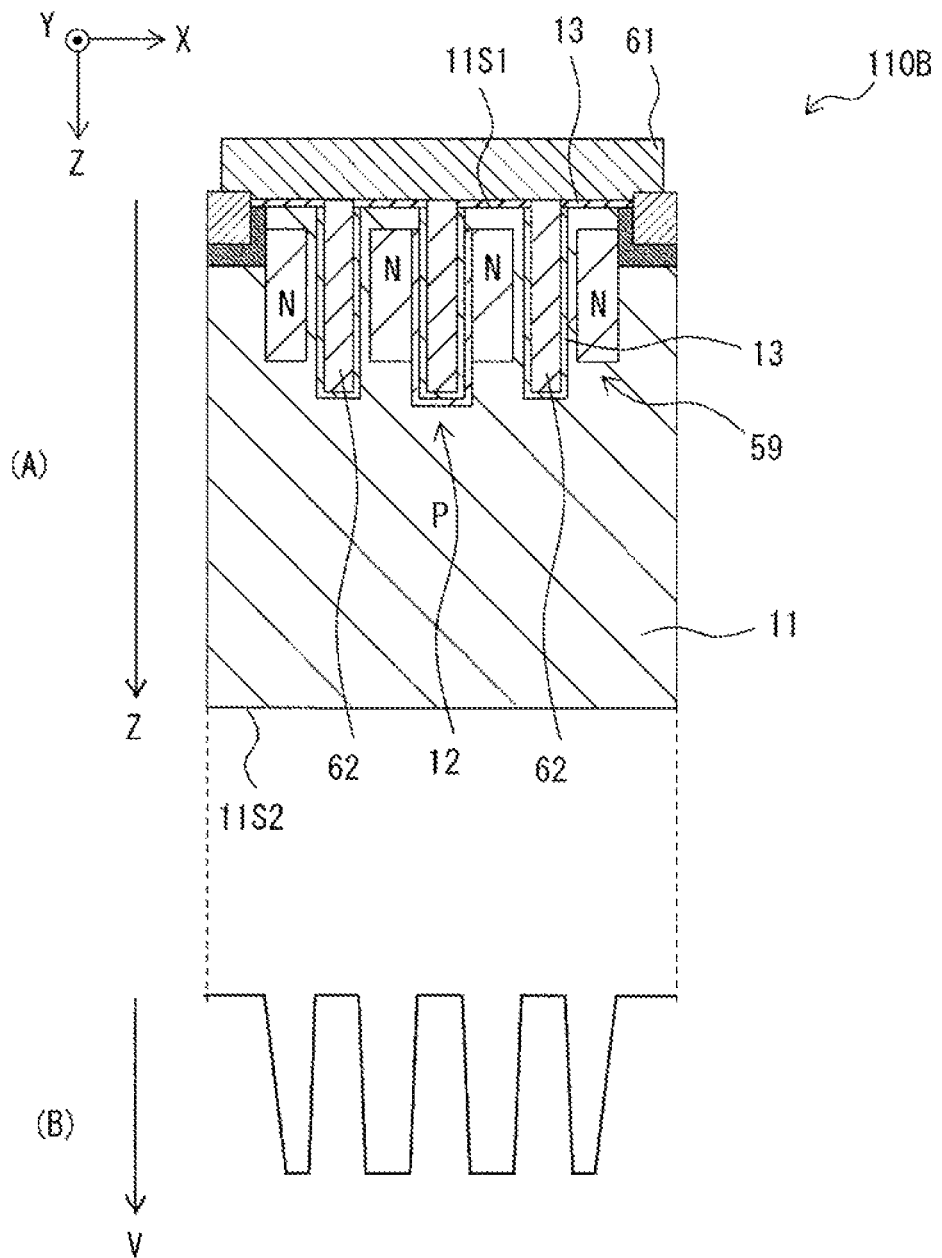

(A) of FIG. 11 is a cross-sectional view schematically illustrating the sensor pixel as the fourth modification example of the first embodiment, and (B) of FIG. 11 is a schematic view of a potential state of the sensor pixel along the cross-section.

Figure 12:
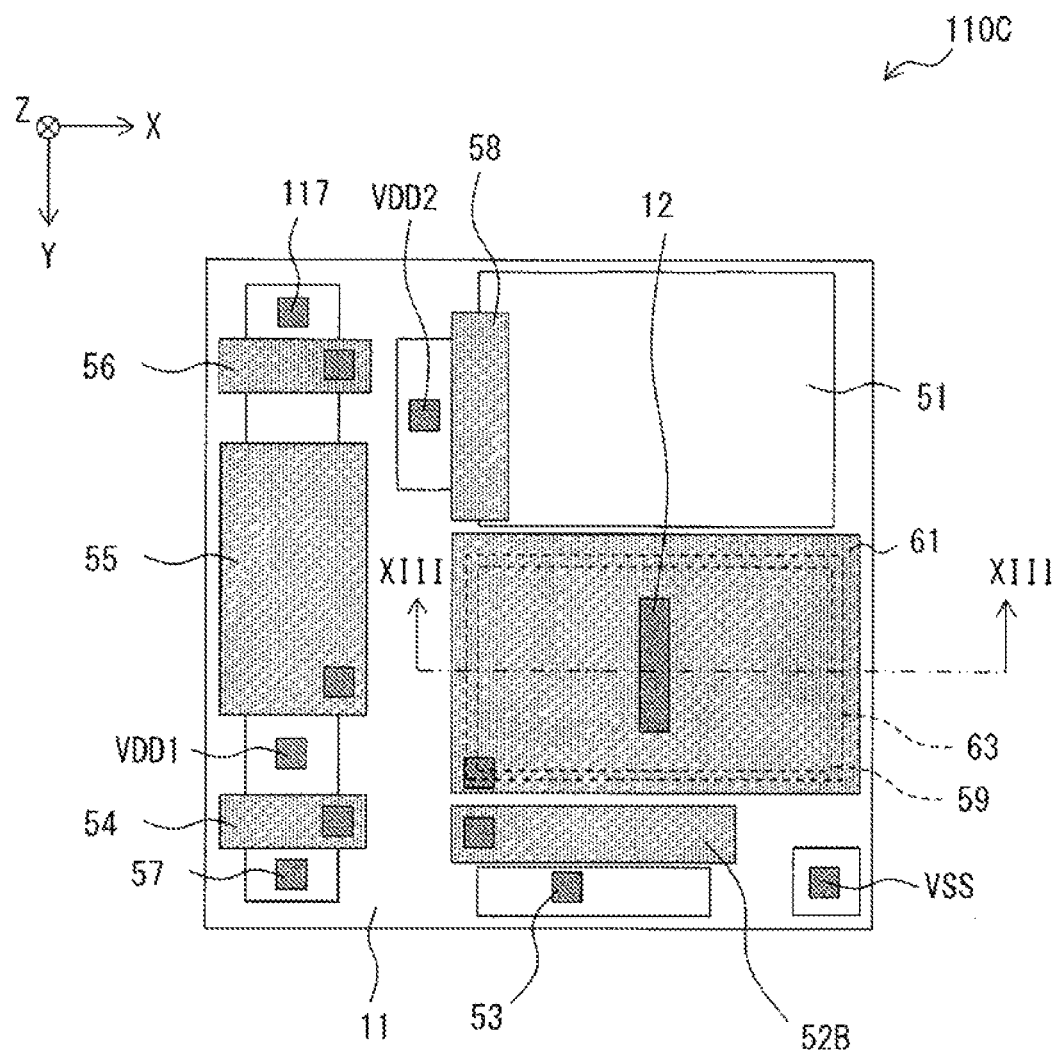

FIG. 12 is a plan view schematically illustrating a sensor pixel as a fifth modification example of the first embodiment.

Figure 13:
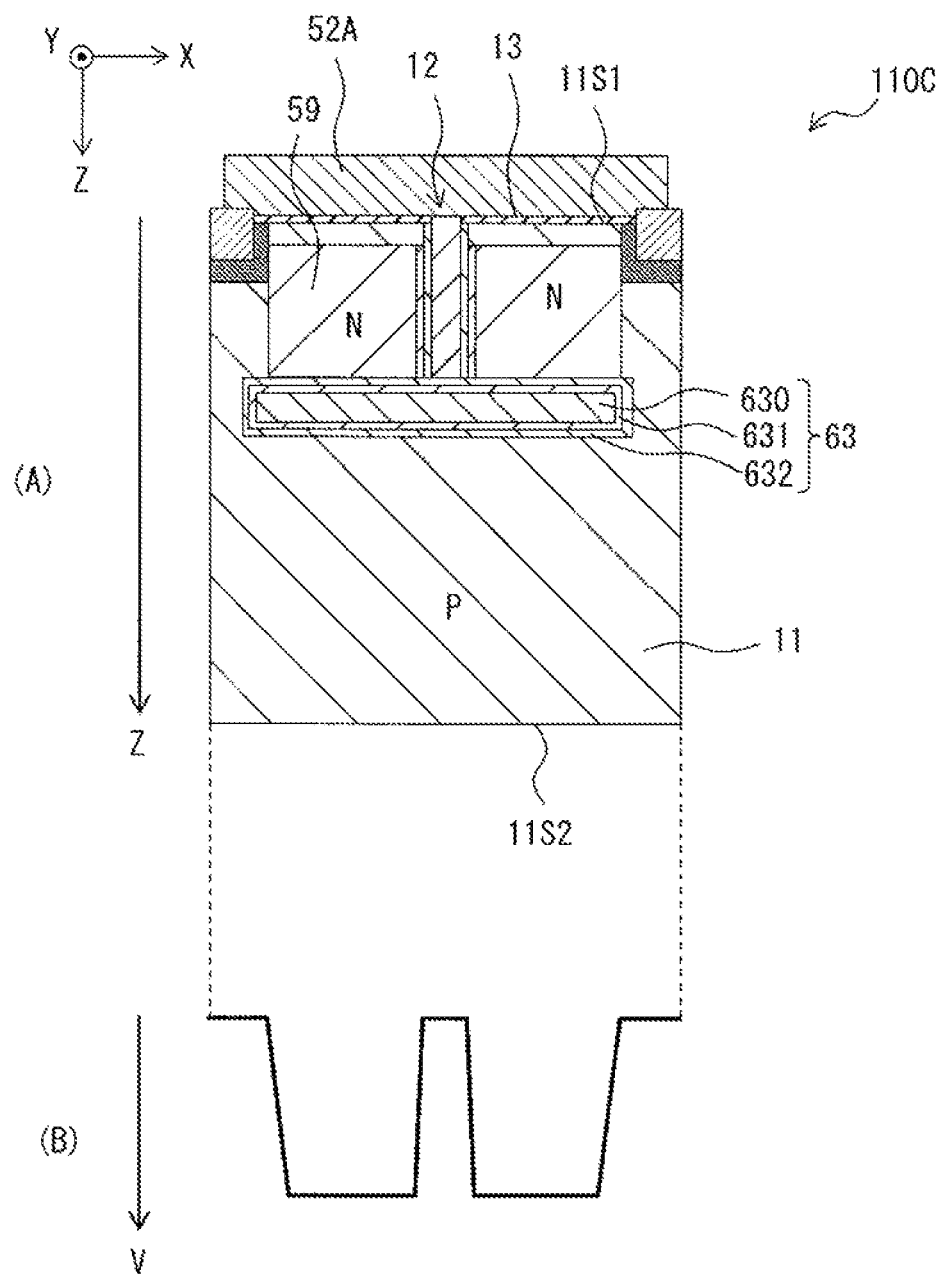

(A) of FIG. 13 is a cross-sectional view schematically illustrating the sensor pixel as the fifth modification example of the first embodiment, and (B) of FIG. 13 is a schematic view of a potential state of the sensor pixel along the cross-section.

Figure 14:
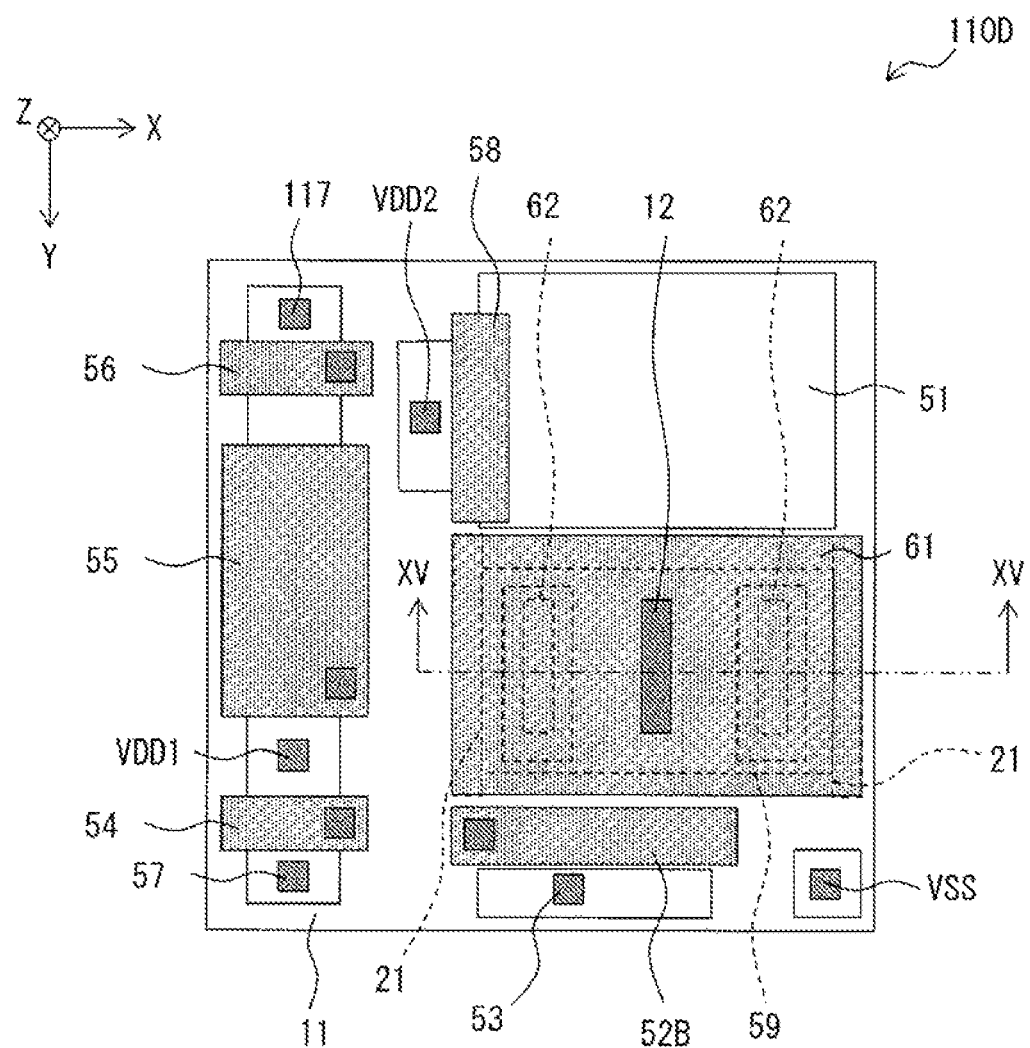

FIG. 14 is a plan view schematically illustrating a sensor pixel as a sixth modification example of the first embodiment.

Figure 15:
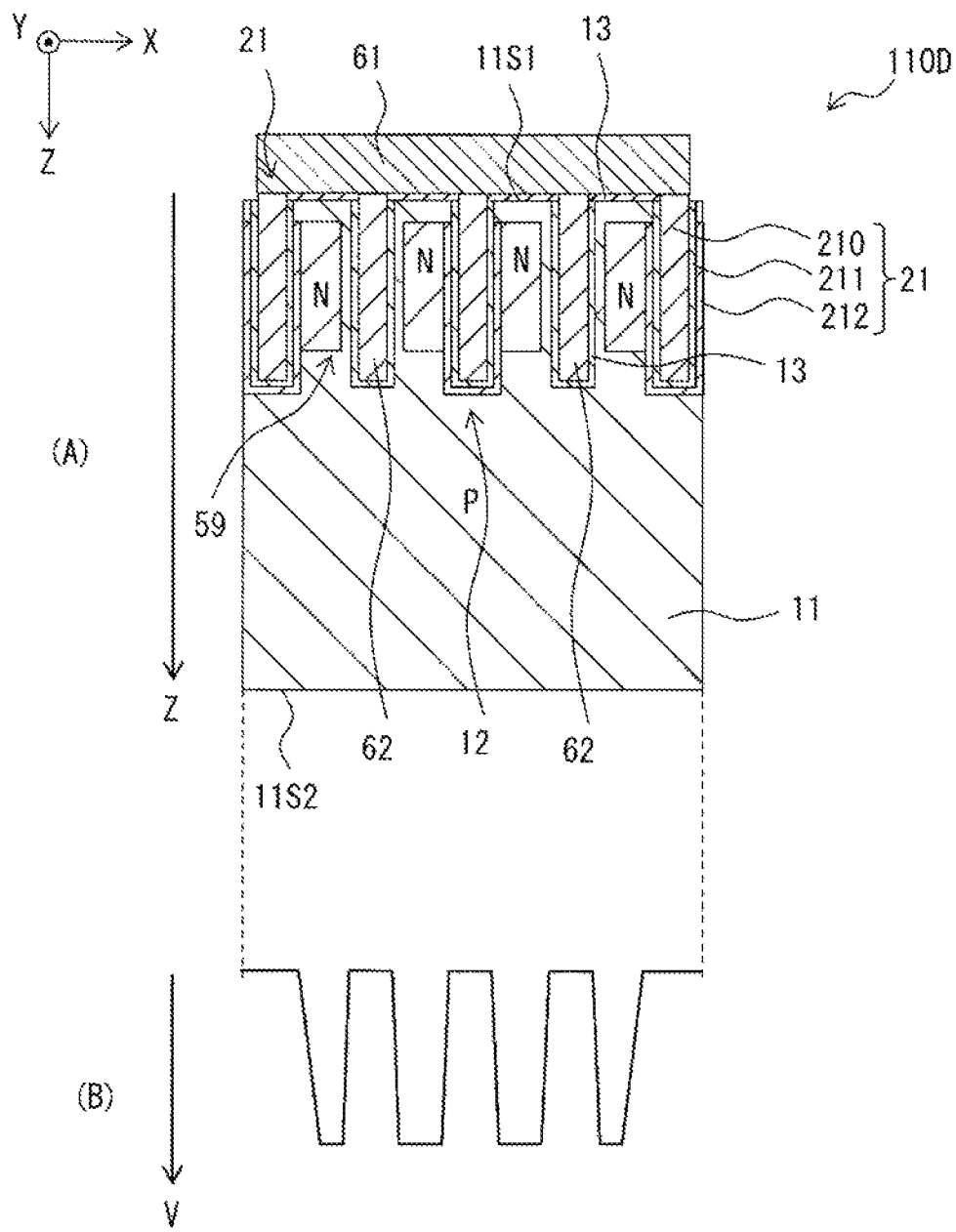

(A) of FIG. 15 is a cross-sectional view schematically illustrating the sensor pixel as the sixth modification example of the first embodiment, and (B) of FIG. 15 is a schematic view of a potential state of the sensor pixel along the cross-section.

Figure 16:
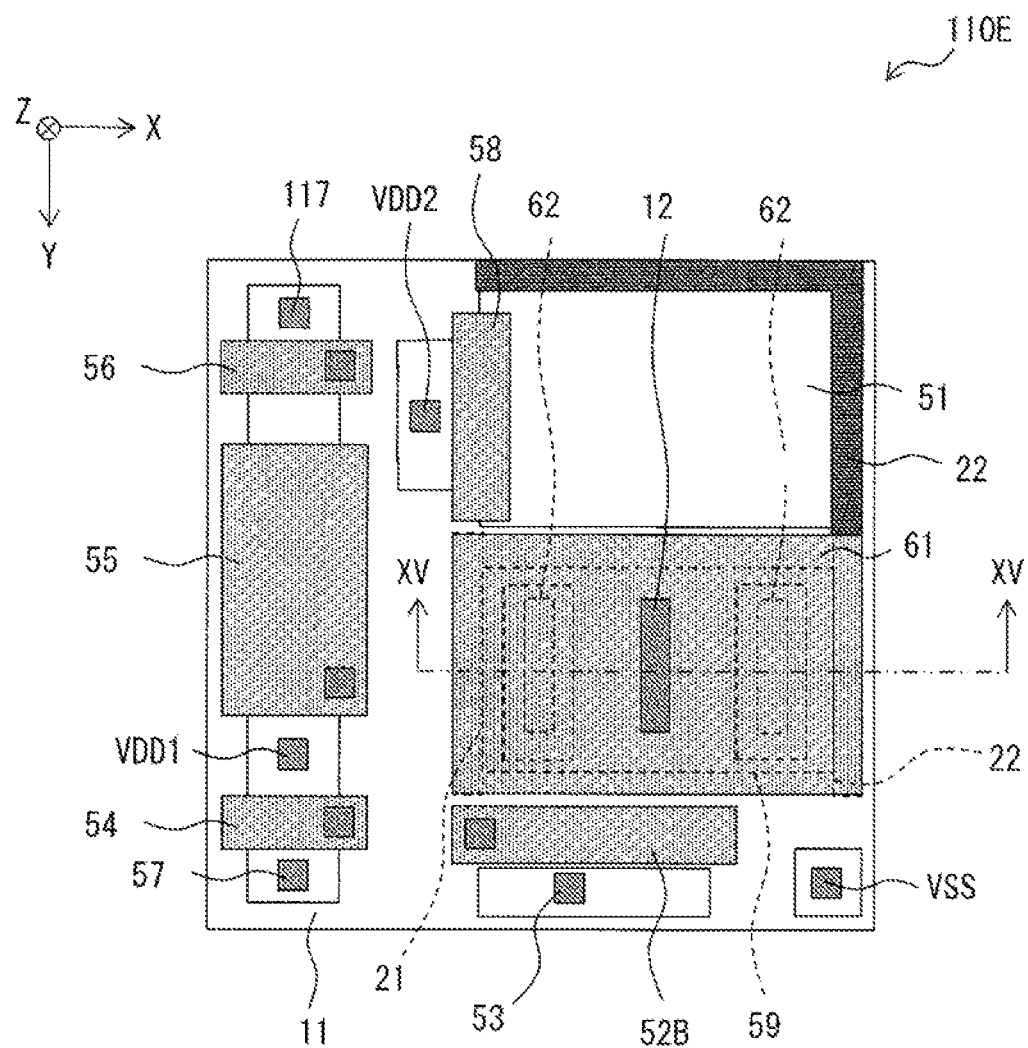

FIG. 16 is a plan view schematically illustrating a sensor pixel as a seventh modification example of the first embodiment.

Figure 17:
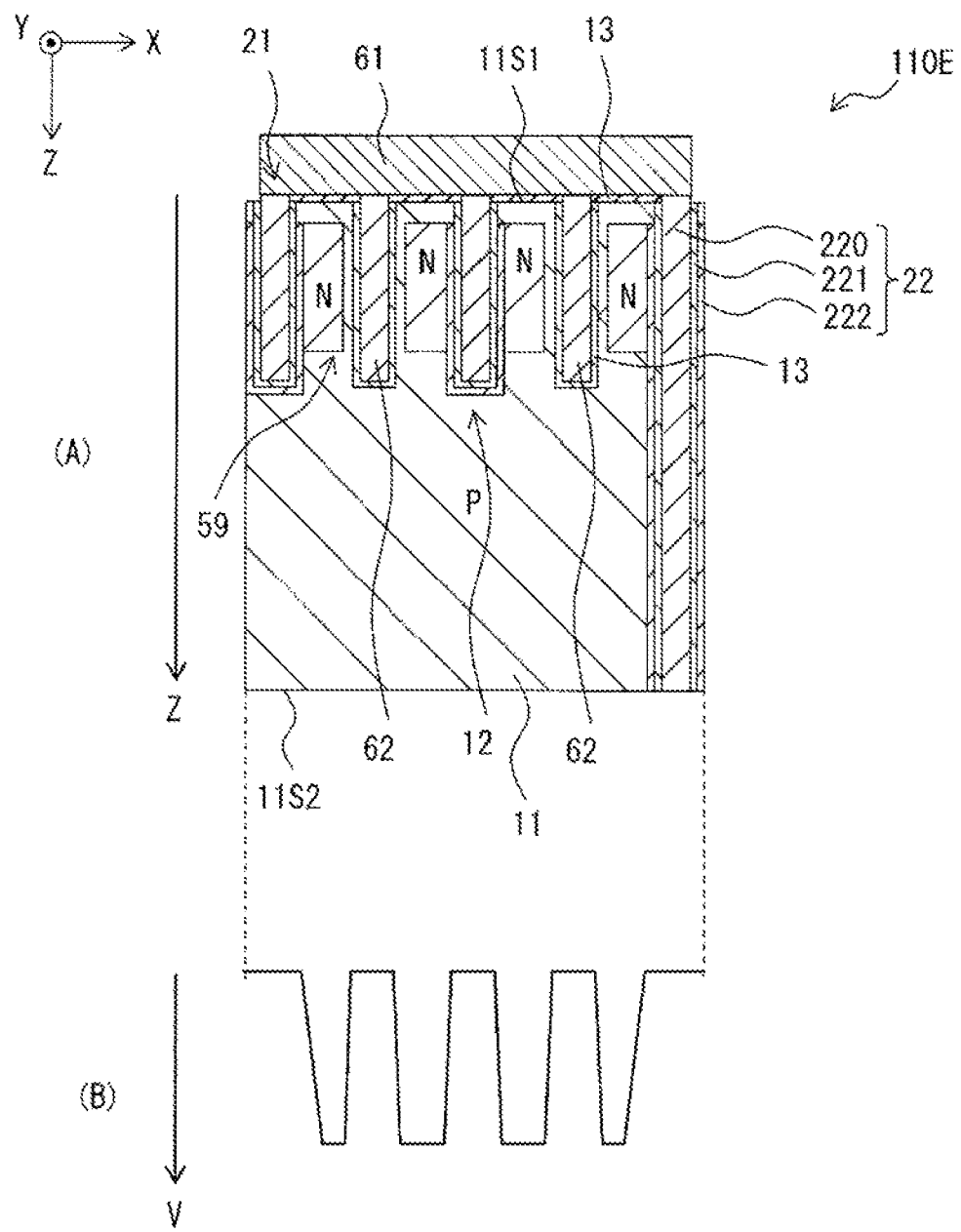

(A) of FIG. 17 is a cross-sectional view schematically illustrating the sensor pixel as the seventh modification example of the first embodiment, and (B) of FIG. 17 is a schematic view of a potential state of the sensor pixel along the cross-section.

Figure 18:
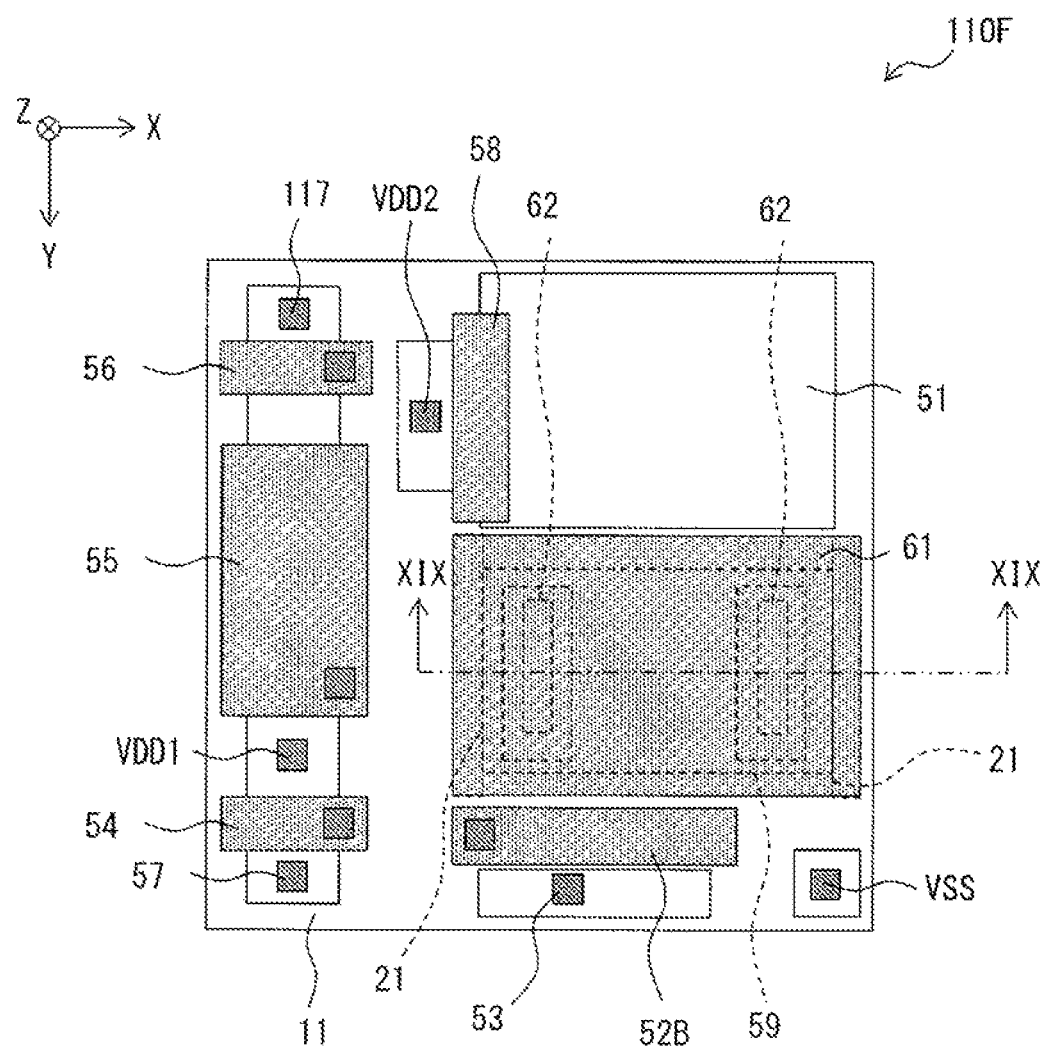

FIG. 18 is a plan view schematically illustrating a sensor pixel as an eighth modification example of the first embodiment.

Figure 19:
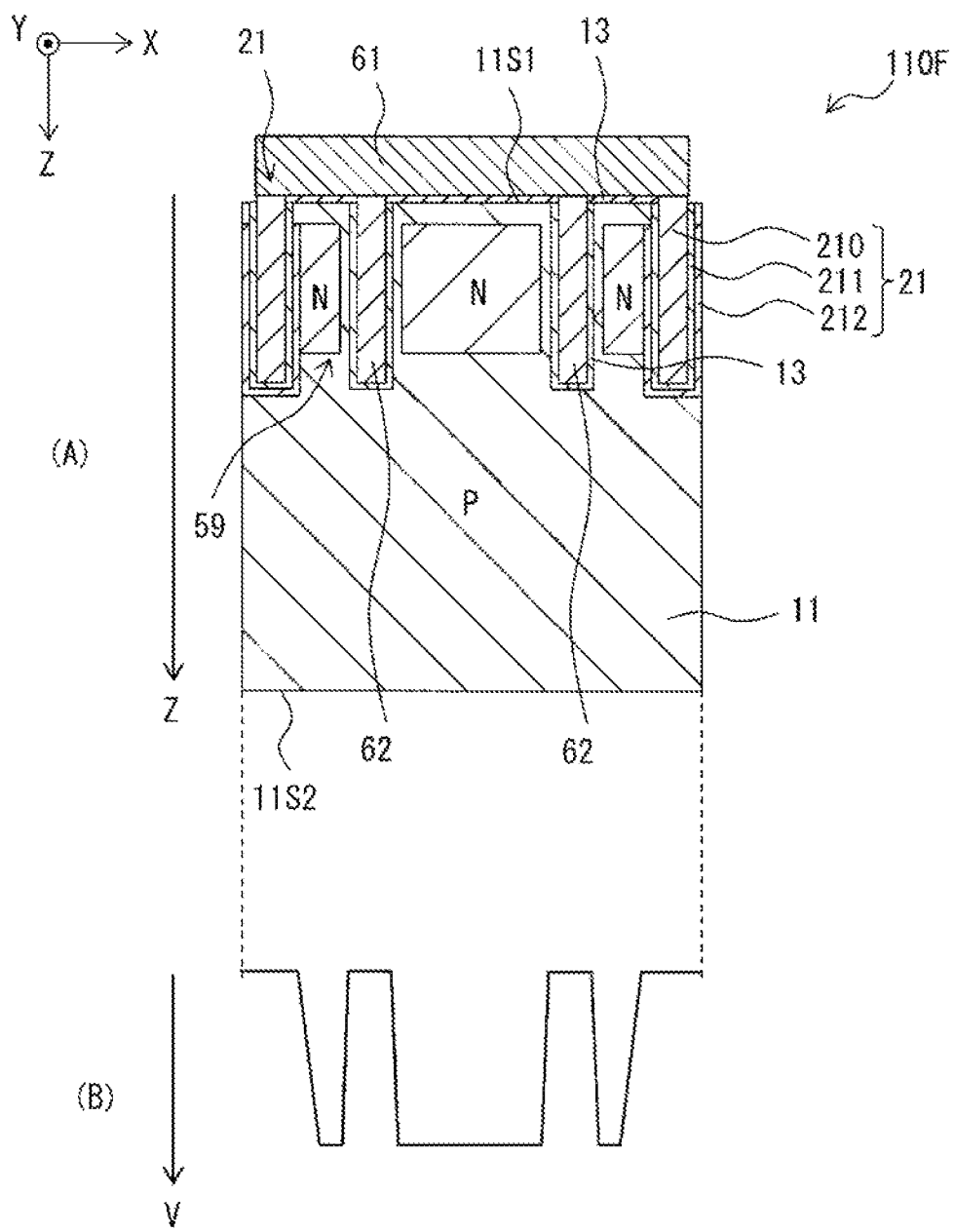

(A) of FIG. 19 is a cross-sectional view schematically illustrating the sensor pixel as the eighth modification example of the first embodiment, and (B) of FIG. 19 is a schematic view of a potential state of the sensor pixel along the cross-section.

Figure 20:
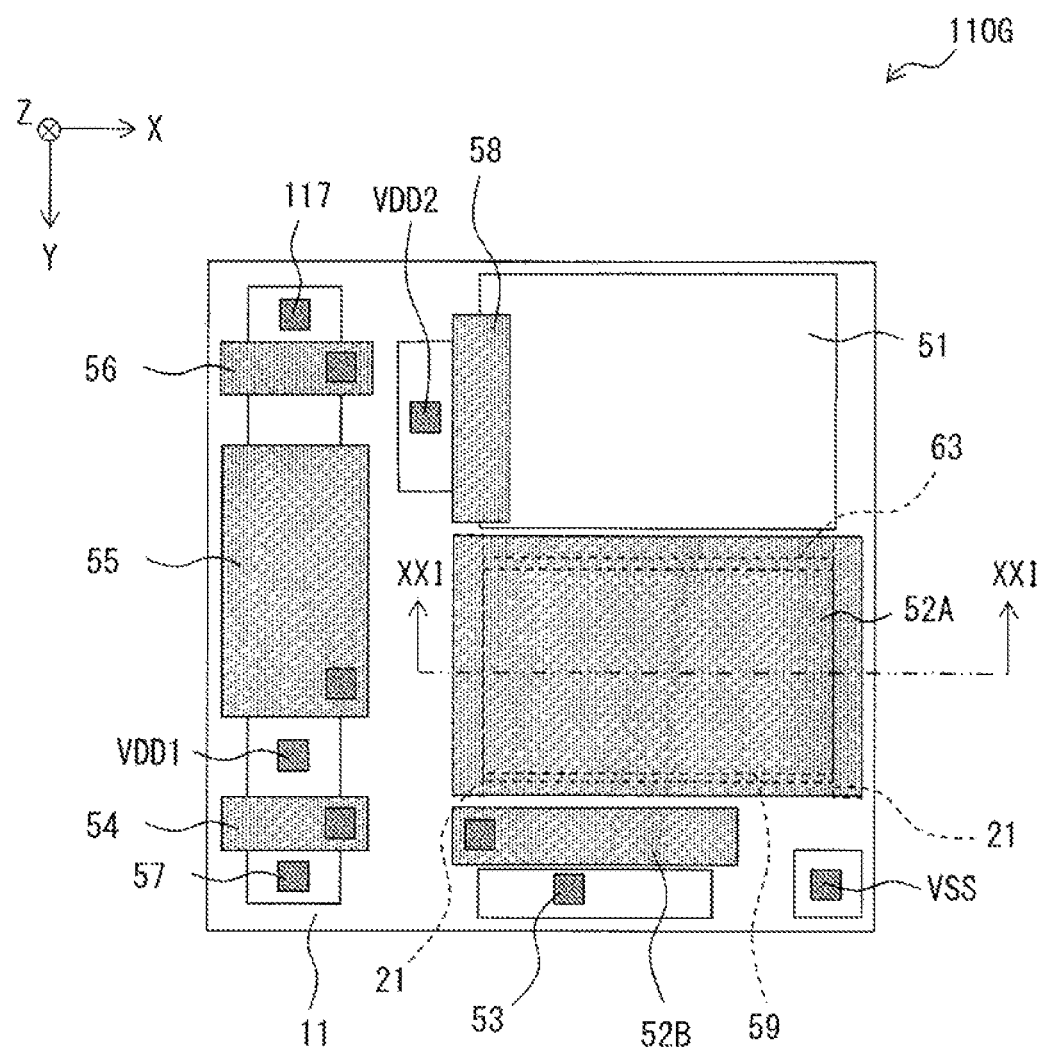

FIG. 20 is a plan view schematically illustrating a sensor pixel as a ninth modification example of the first embodiment.

Figure 21:
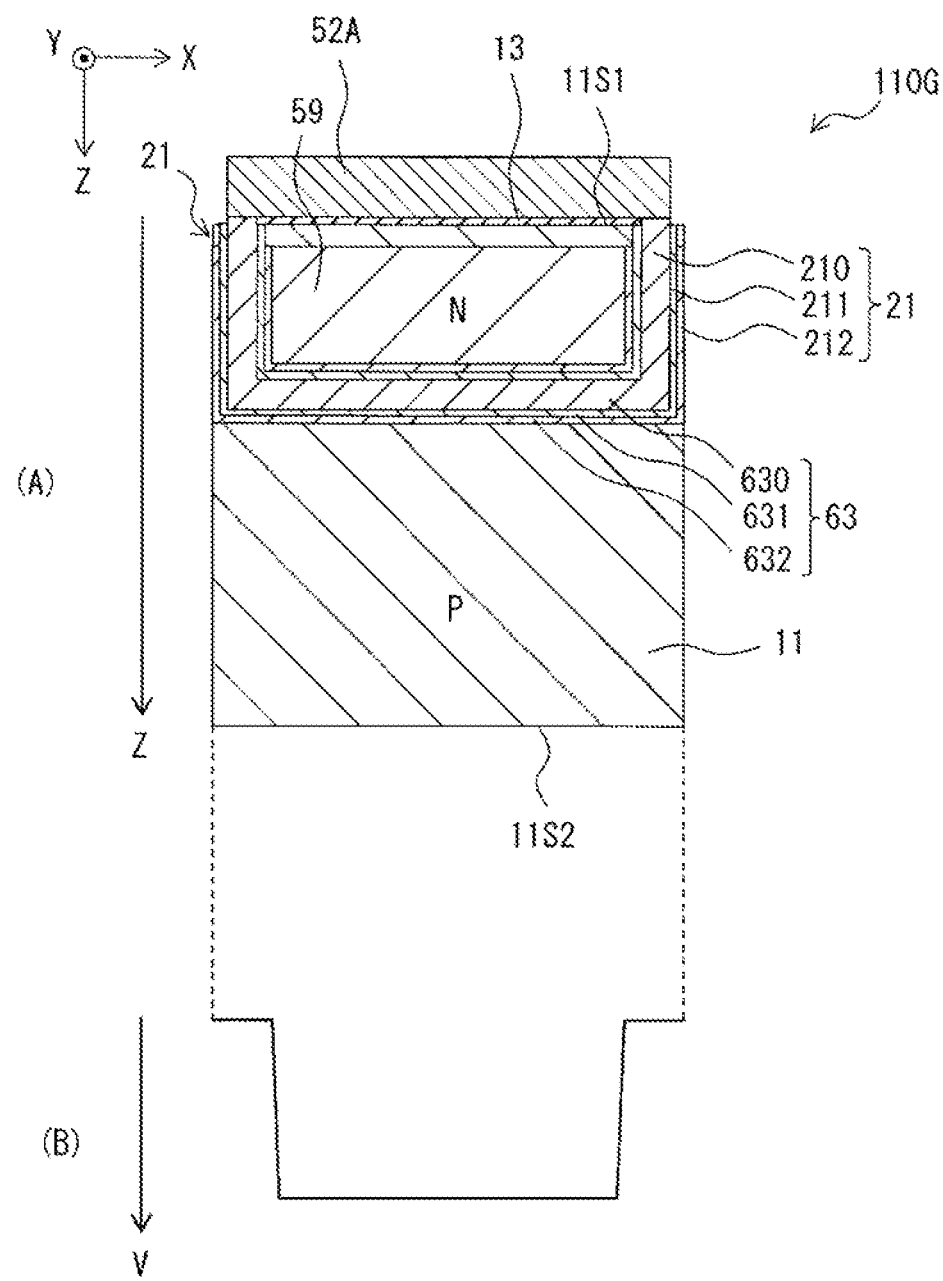

(A) of FIG. 21 is a cross-sectional view schematically illustrating the sensor pixel as the ninth modification example of the first embodiment, and (B) of FIG. 21 is a schematic view of a potential state of the sensor pixel along the cross-section.

Figure 22:
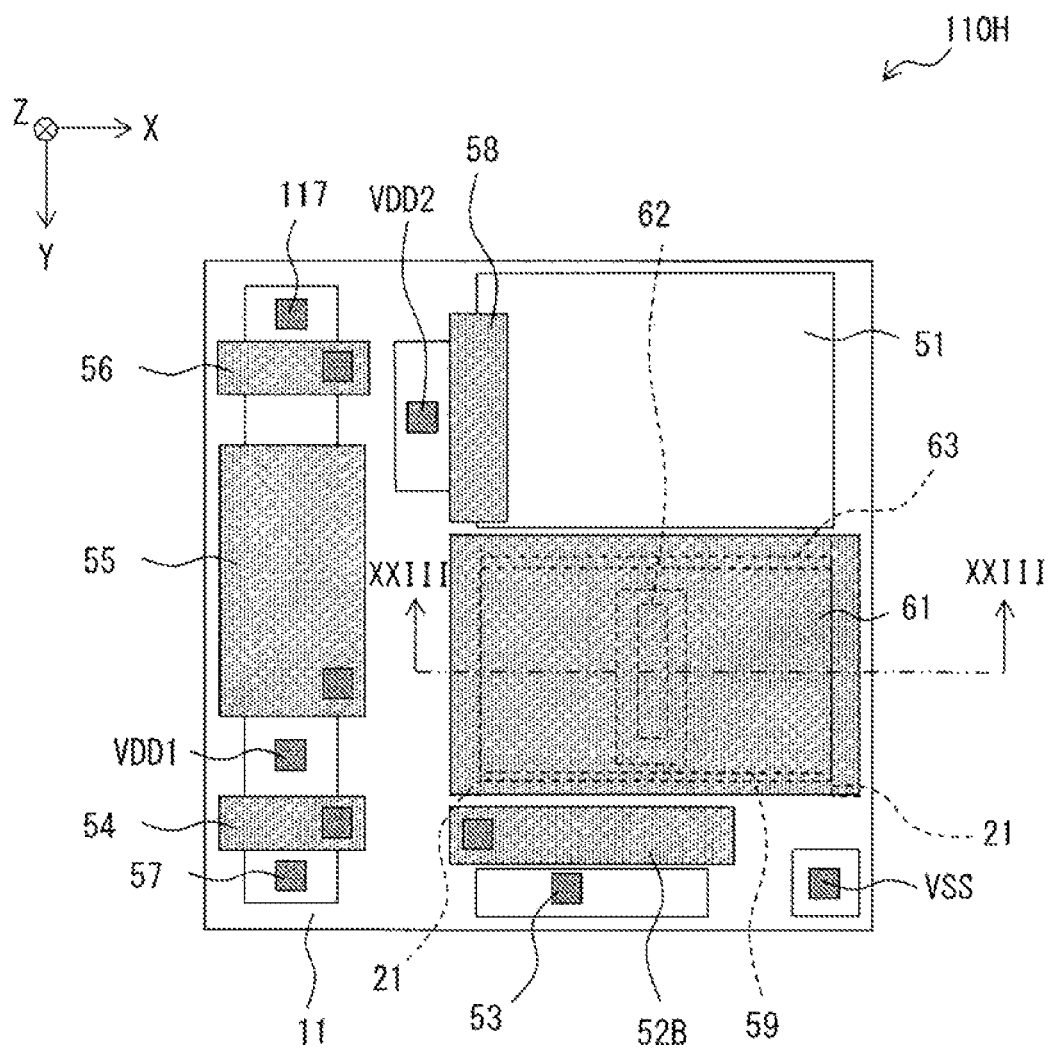

FIG. 22 is a plan view schematically illustrating a sensor pixel as a tenth modification example of the first embodiment.

Figure 23:
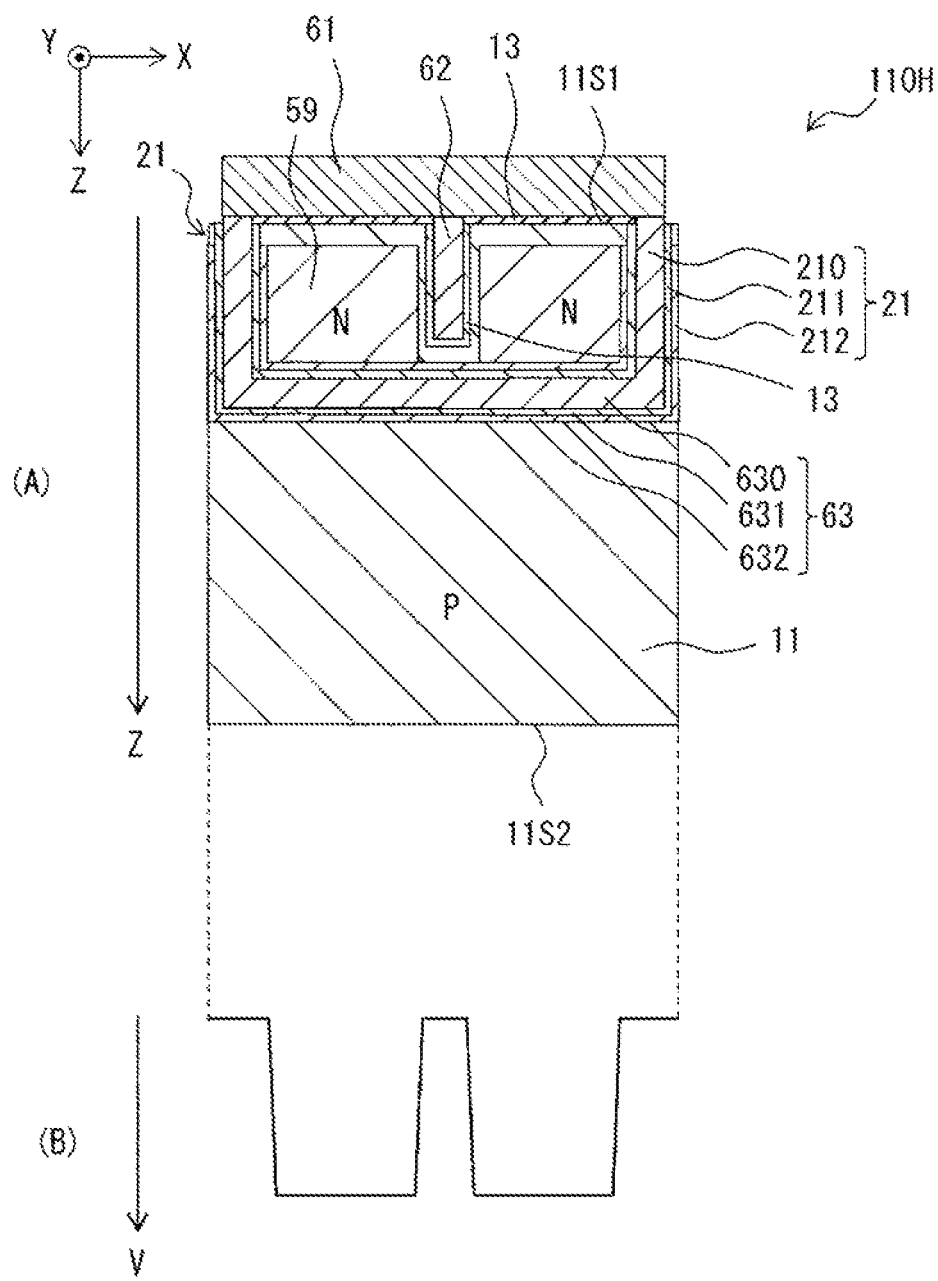

(A) of FIG. 23 is a cross-sectional view schematically illustrating the sensor pixel as the tenth modification example of the first embodiment, and (B) of FIG. 23 is a schematic view of a potential state of the sensor pixel along the cross-section.

Figure 24:
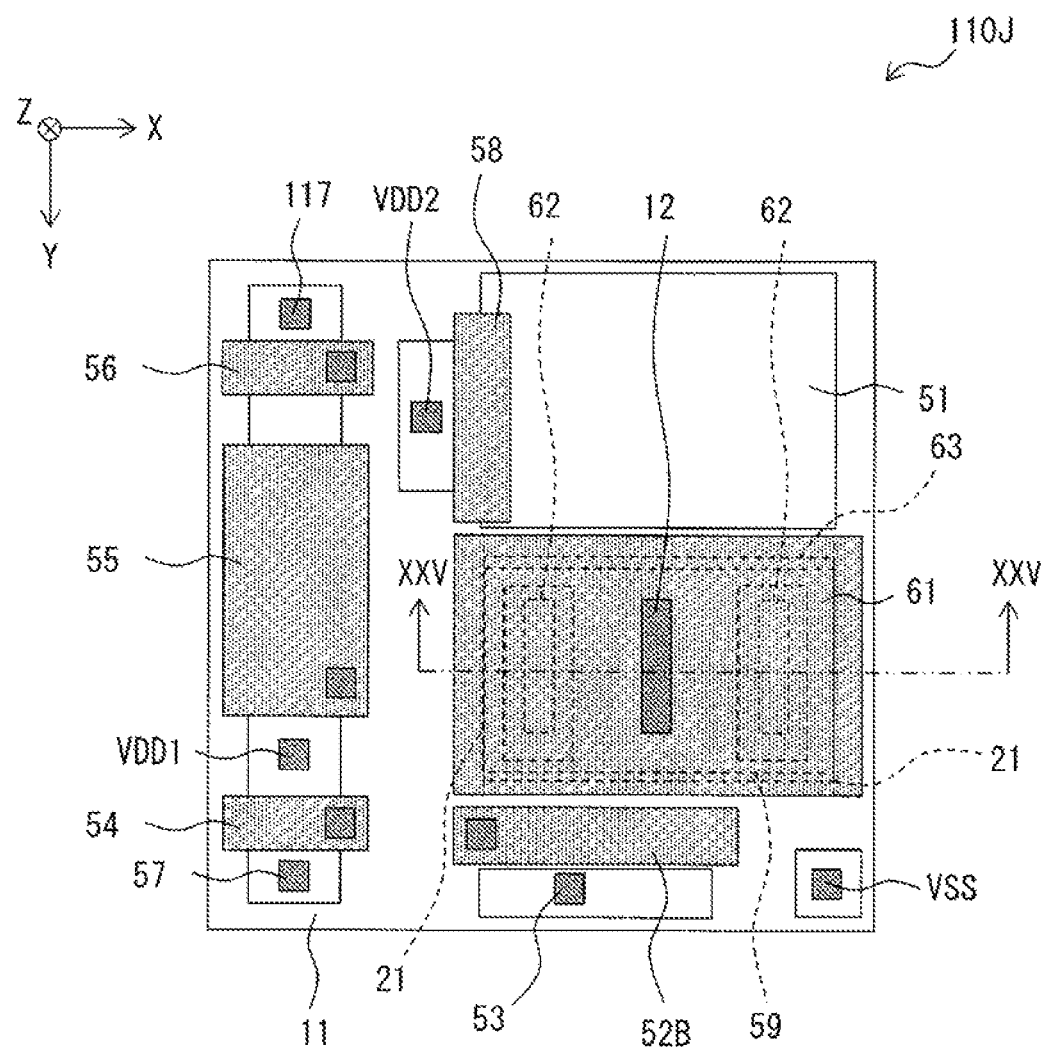

FIG. 24 is a plan view schematically illustrating a sensor pixel as an eleventh modification example of the first embodiment.

Figure 25:
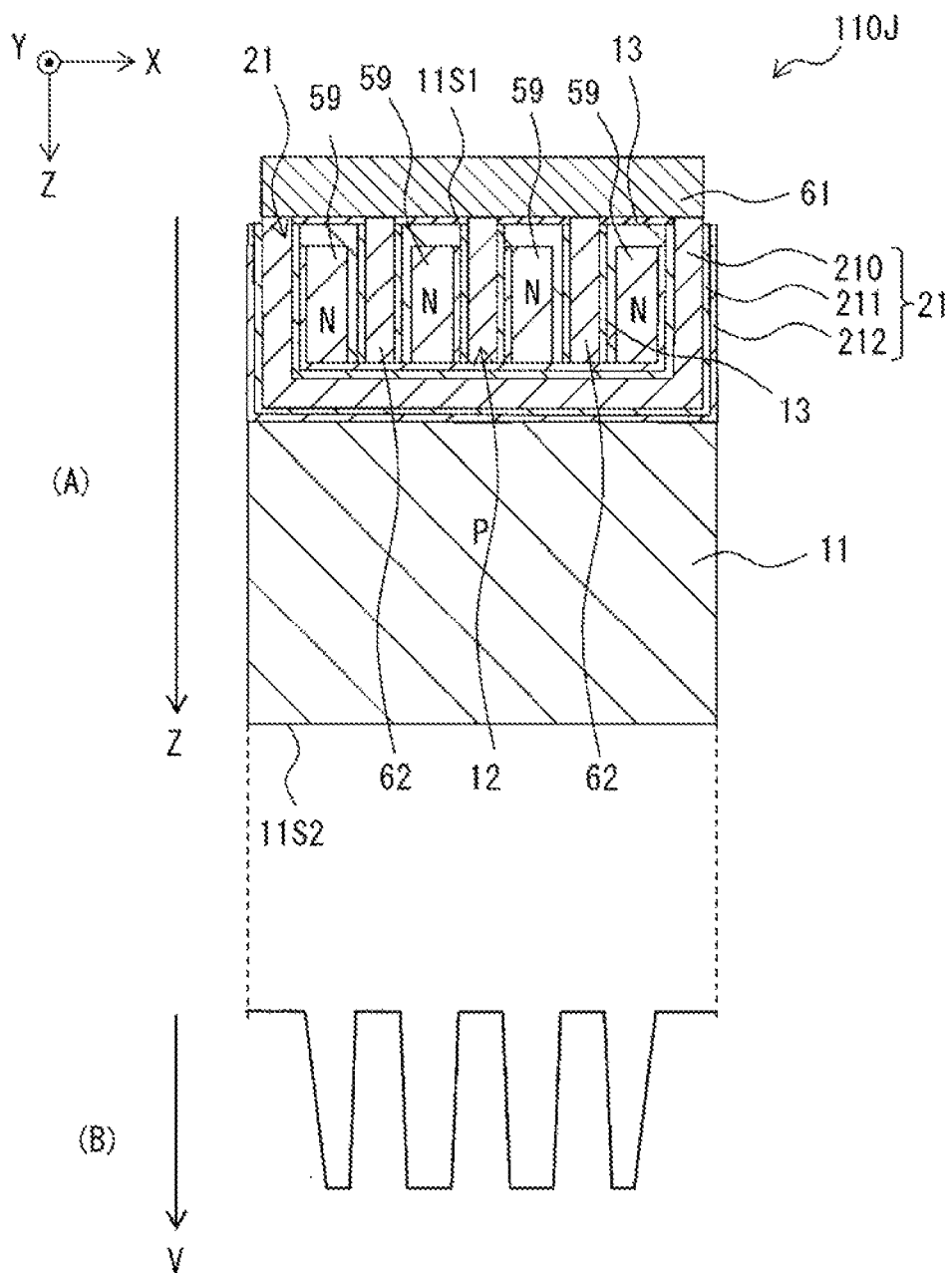

(A) of FIG. 25 is a cross-sectional view schematically illustrating the sensor pixel as the eleventh modification example of the first embodiment, and (B) of FIG. 25 is a schematic view of a potential state of the sensor pixel along the cross-section.

Figure 26:
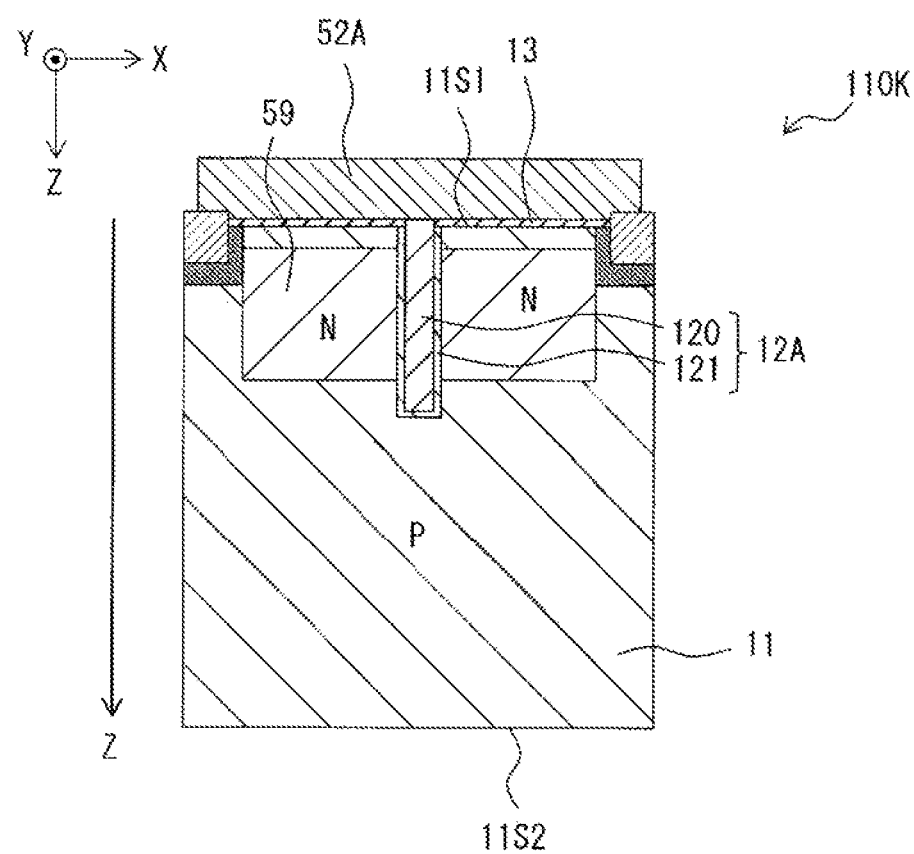

(A) of FIG. 26 is a cross-sectional view schematically illustrating a sensor pixel as a twelfth modification example of the first embodiment, and (B) of FIG. 26 is a schematic view of a potential state of the sensor pixel along the cross-section.

Figure 27:
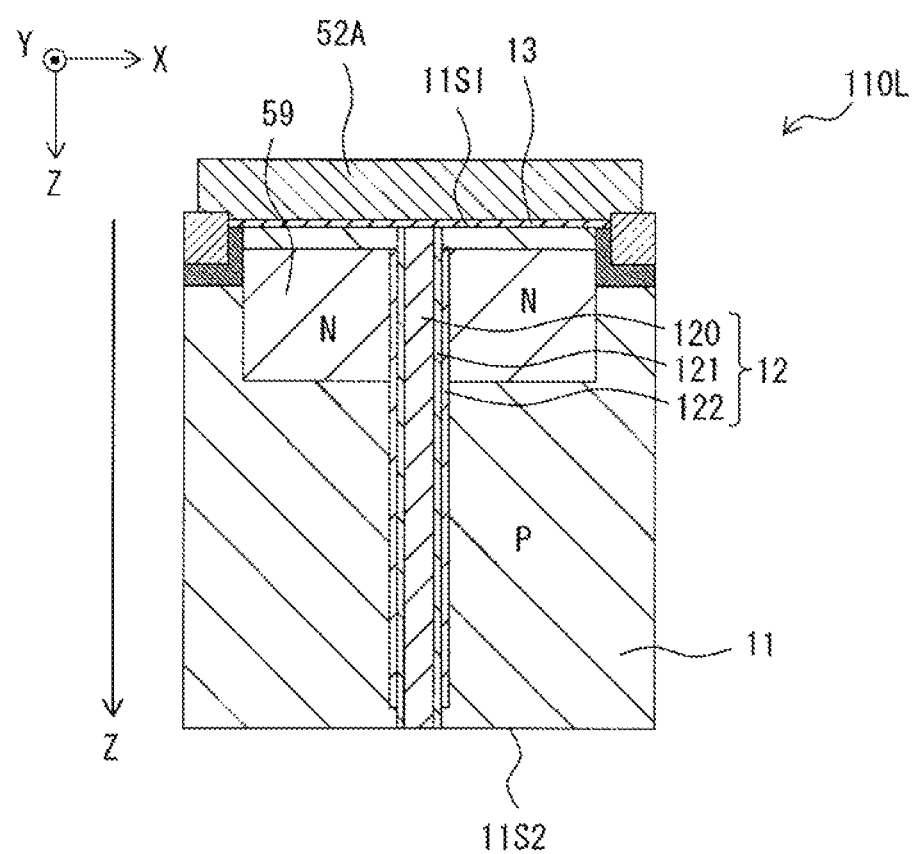

(A) of FIG. 27 is a cross-sectional view schematically illustrating a sensor pixel as a thirteenth modification example of the first embodiment, and (B) of FIG. 27 is a schematic view of a potential state of the sensor pixel along the cross-section.

Figure 28:
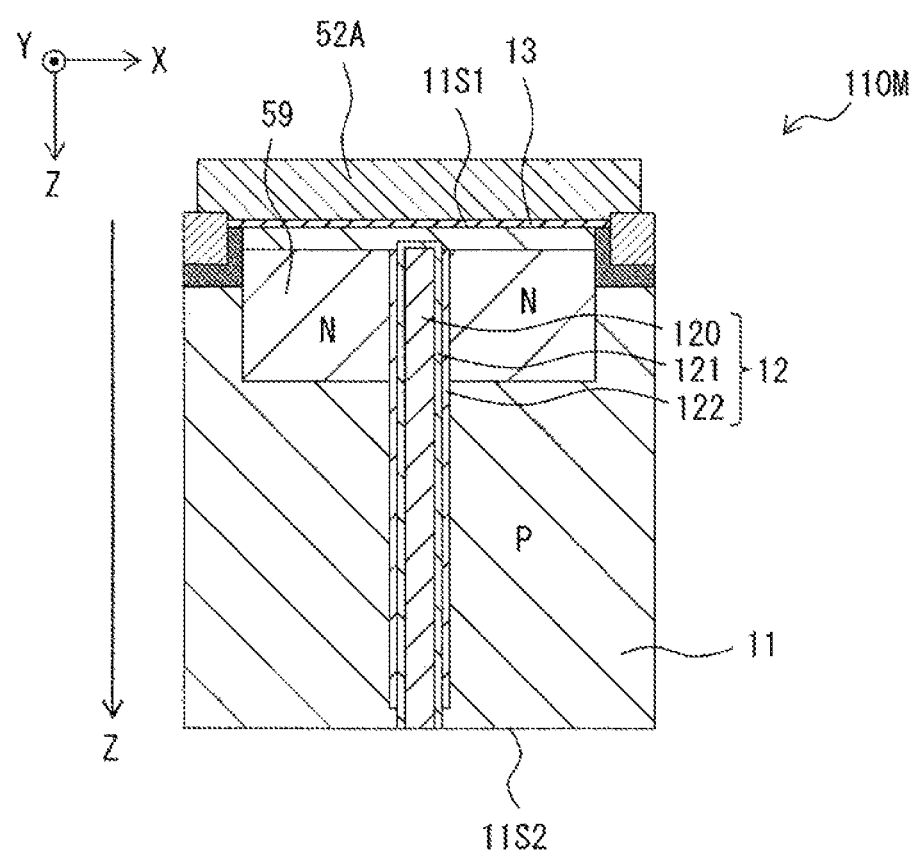

(A) of FIG. 28 is a cross-sectional view schematically illustrating a sensor pixel as a fourteenth modification example of the first embodiment, and (B) of FIG. 28 is a schematic view of a potential state of the sensor pixel along the cross-section.

Figure 29:
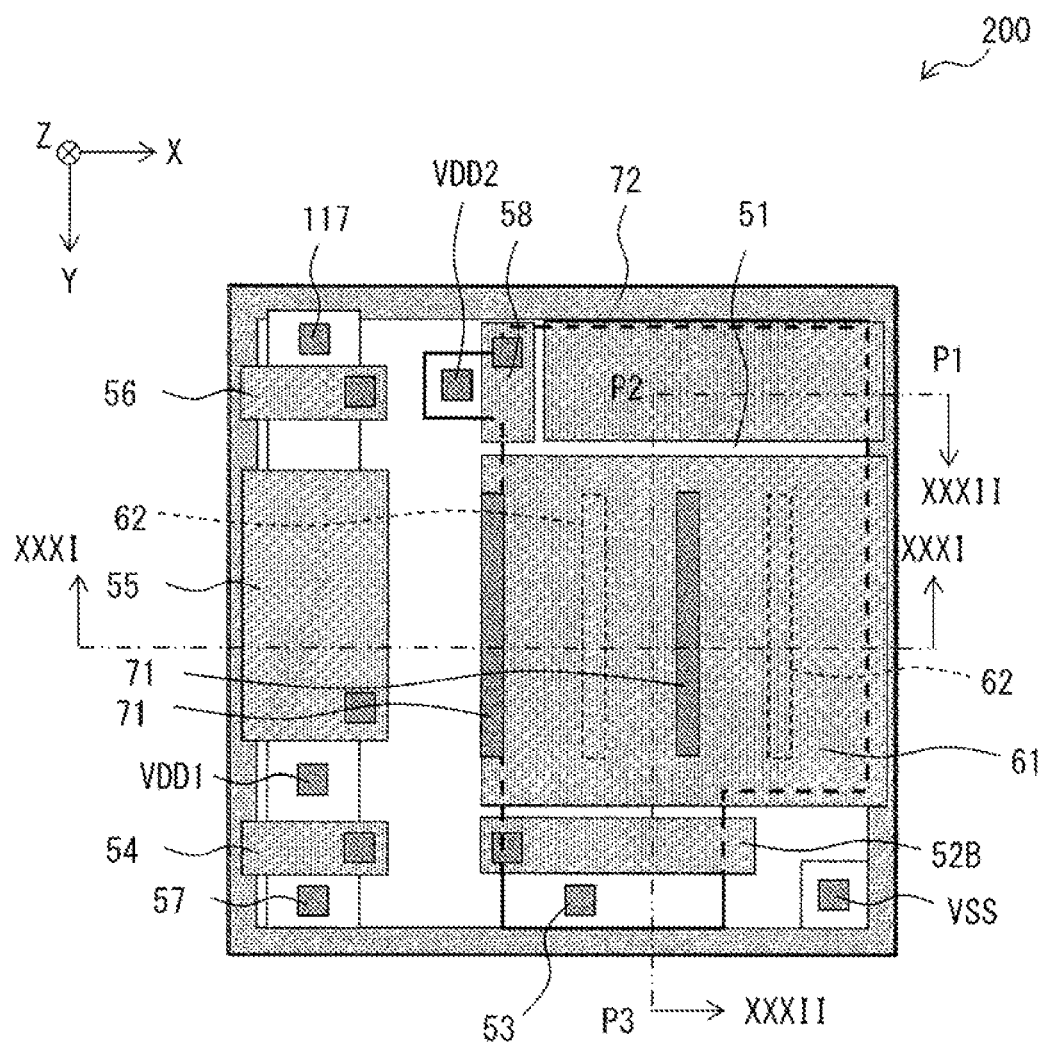

FIG. 29 is a plan view schematically illustrating a configuration of a portion of a sensor pixel in an imaging device according to a second embodiment of the present disclosure.

Figure 30:
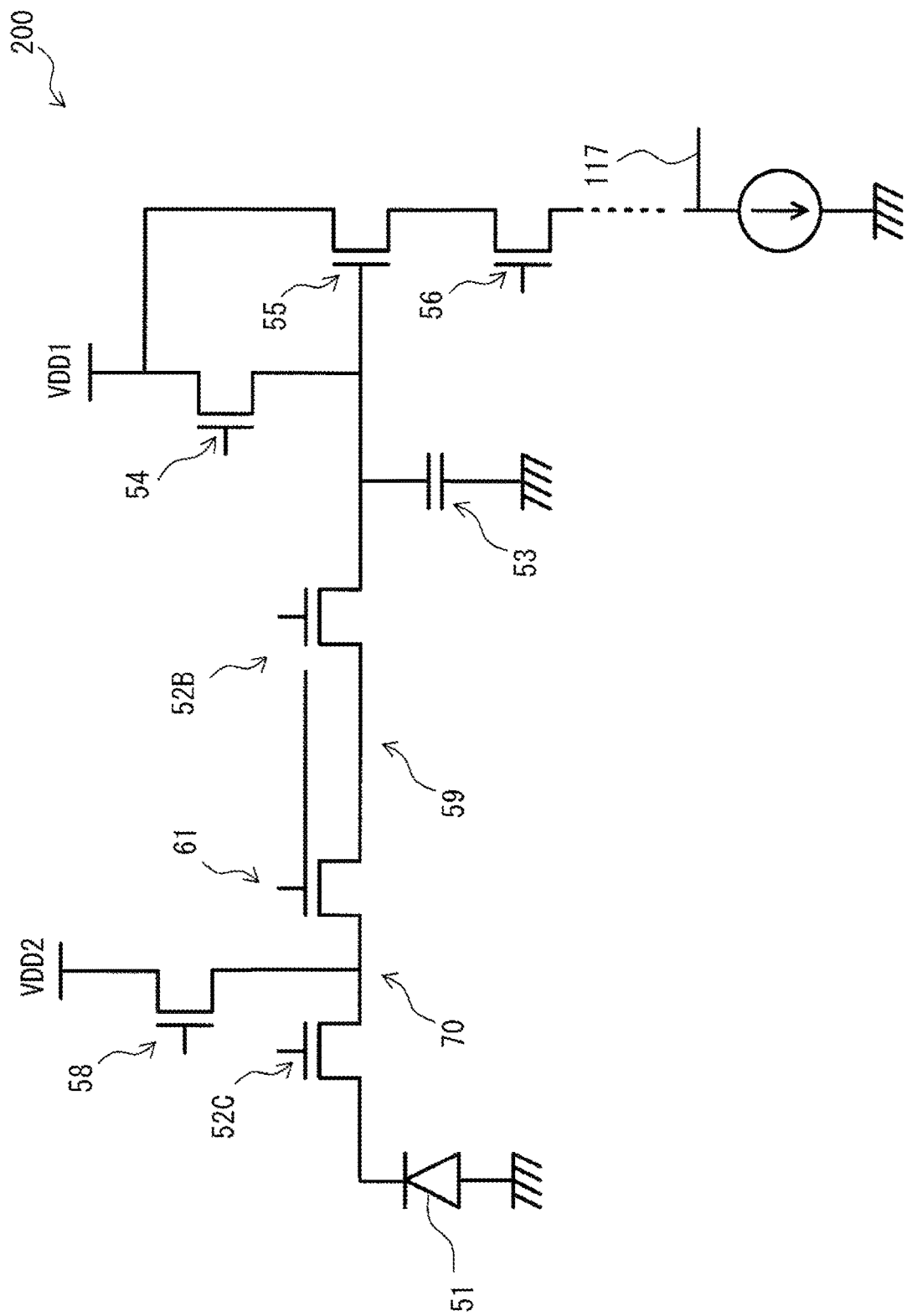

FIG. 30 is a circuit diagram illustrating a circuit configuration of the sensor pixel illustrated in FIG. 29.

Figure 31:
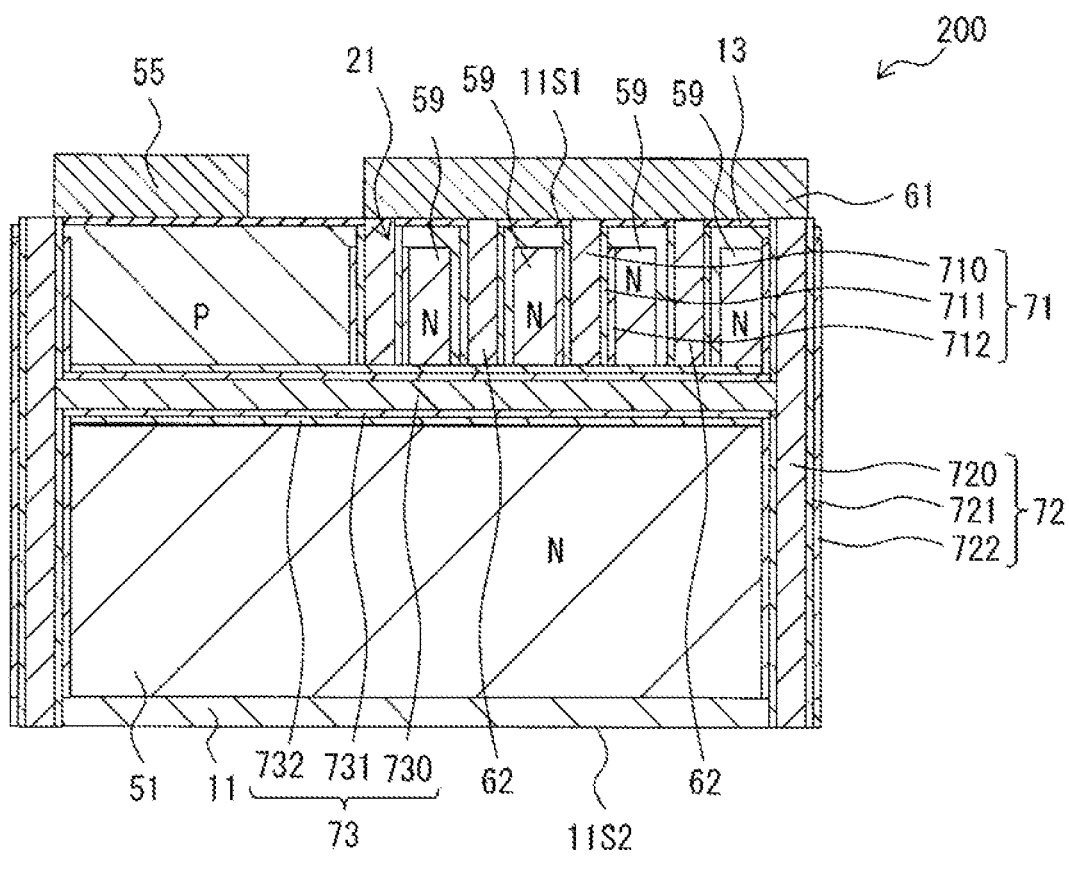
Figure 31:
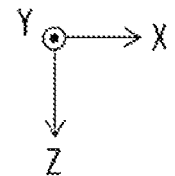

FIG. 31 is a first cross-sectional view schematically illustrating the configuration of the sensor pixel illustrated in FIG. 29.

Figure 32:
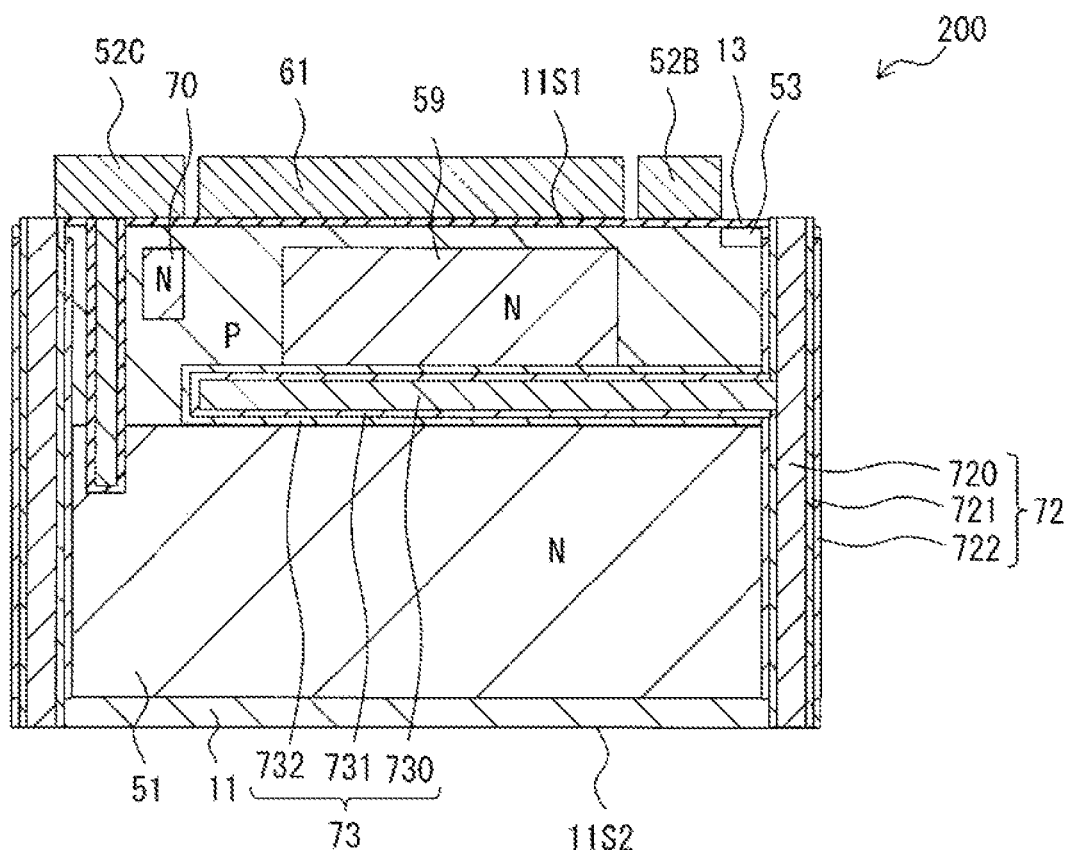

FIG. 32 is a second cross-sectional view schematically illustrating the configuration of the sensor pixel illustrated in FIG. 29.

Figure 33:
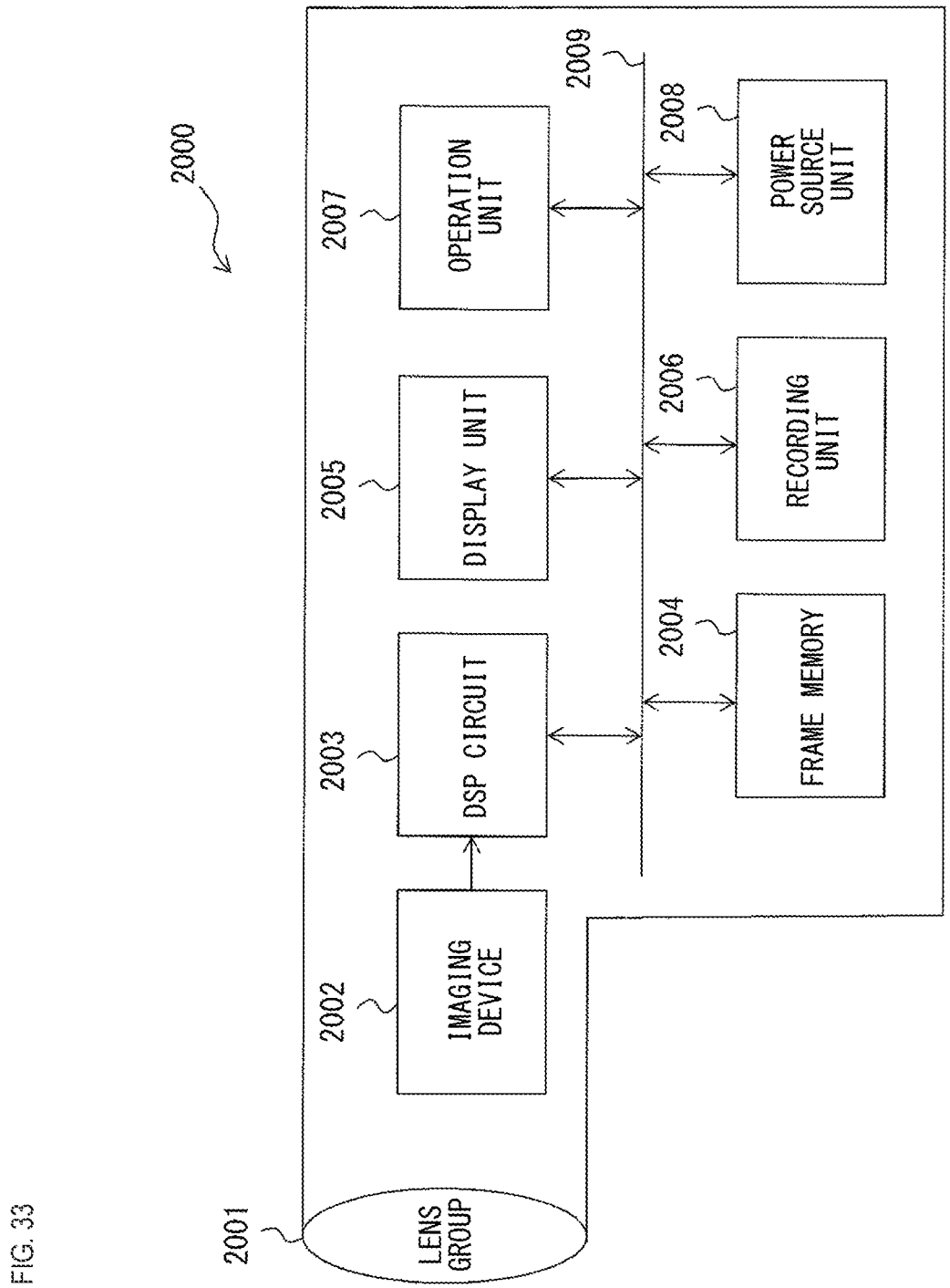

FIG. 33 is a schematic view of an overall configuration example of an electronic apparatus.

Figure 34:
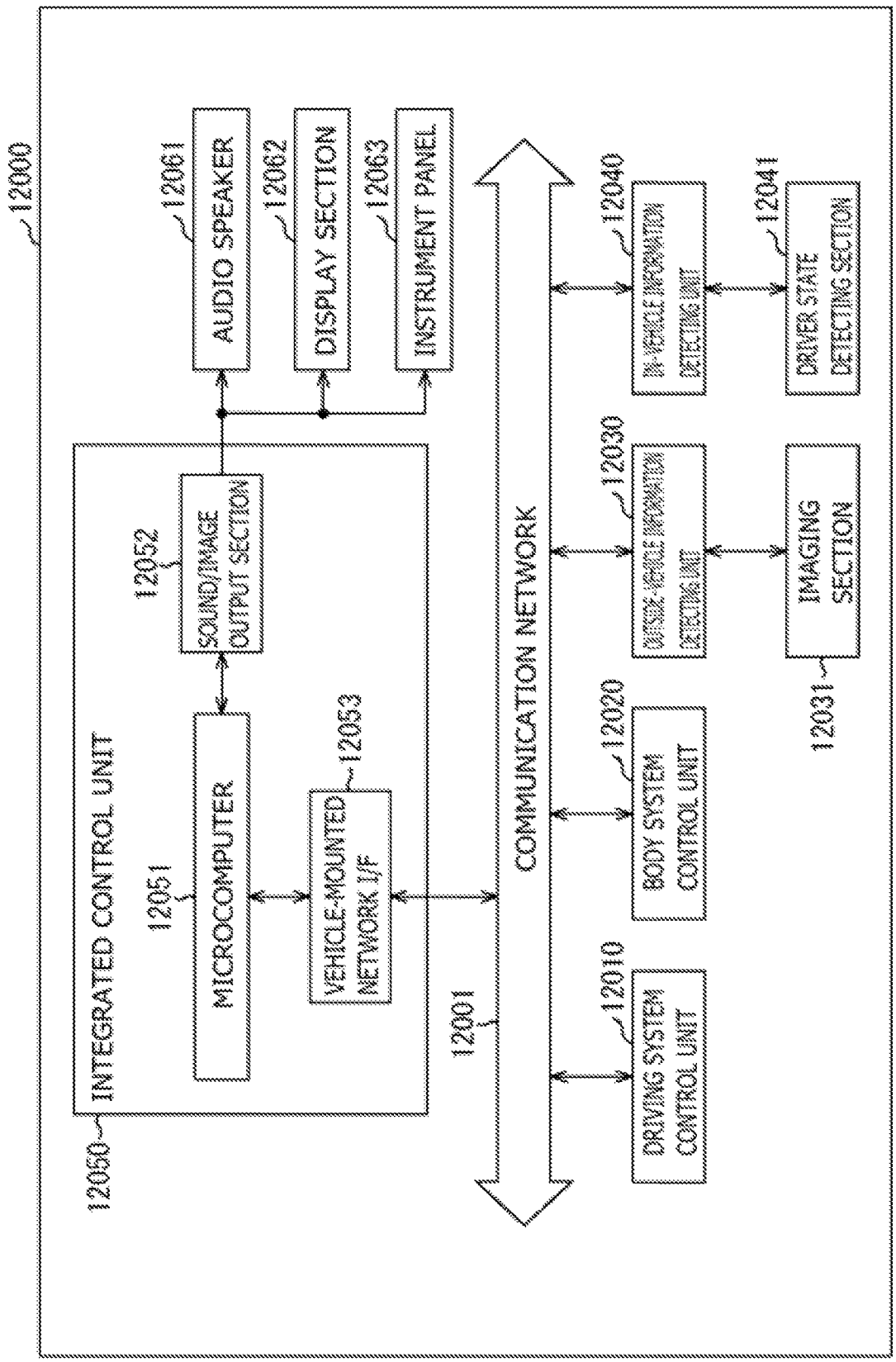

FIG. 34 is a block diagram depicting an example of schematic configuration of a vehicle control system.

Figure 35:
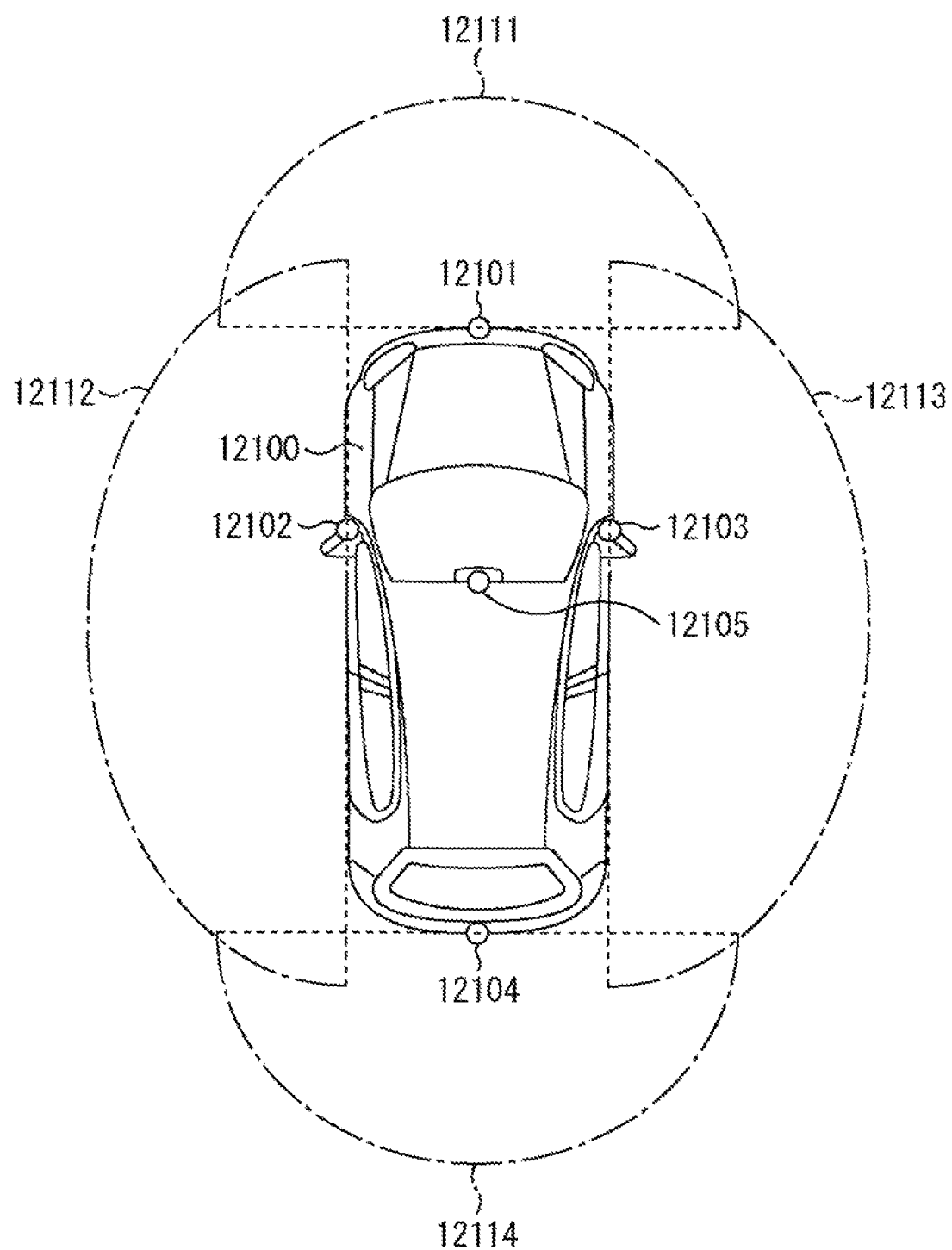

FIG. 35 is a diagram of assistance in explaining an example of installation positions of an outside-vehicle information detecting section and an imaging section.

MODES FOR CARRYING OUT THE INVENTION

Hereinafter, description is given in detail of embodiments of the present disclosure with reference to the drawings. It is to be noted that description is given in the following order.
1. First Embodiment
An example of a solid-state imaging device in which a trench section is provided in a charge-holding section adjacent to a photoelectric conversion section in an in-plane direction.
2. Modification Example of First Embodiment
3. Second Embodiment
An example of a sensor pixel in which a photoelectric conversion section and a charge-holding section are stacked in a depth direction of a semiconductor substrate.
4. Example of Application to Electronic Apparatus
5. Example of Application to Mobile Body
6. Other Modification Examples 1. First Embodiment

[Configuration of Solid-State Imaging Device 101A]
FIG. 1A is a block diagram illustrating a configuration example of functions of a solid-state imaging device 101A according to a first embodiment of the present technology.

The solid-state imaging device 101A is, for example, a backside illumination type image sensor of a so-called global shutter system, such as a CMOS (Complementary Metal Oxide Semiconductor) image sensor. The solid-state imaging device 101A receives light from a subject and performs photoelectric conversion to generate an image signal, thereby capturing an image.

The global shutter system is a system in which global exposure is performed, which basically starts exposure simultaneously for all of pixels and finishes the exposure simultaneously for all of the pixels. As used herein, all of the pixels refer to all of pixels of a portion appearing in an image, and exclude a dummy pixel, or the like. In addition, the global shutter system also includes a system in which a region where global exposure is performed is moved while performing global exposure in a unit of a plurality of rows (e.g., several tens of rows) instead of all of pixels simultaneously when a time difference or an image distortion is small enough to be unproblematic. In addition, the global shutter system also includes a system in which global exposure is performed on pixels of a predetermined region, instead of all of the pixels of the portion appearing in the image.

The backside illumination type image sensor refers to an image sensor having a configuration in which a photoelectric conversion section such as a photodiode that receives light from a subject and converts the light into an electric signal is provided between a light-receiving surface on which light from the subject is incident and a wiring layer provided with a wiring line of a transistor, etc. that drives each pixel.

The solid-state imaging device 101A includes, for example, a pixel array section 111, a vertical drive section 112, a column signal processing section 113, a data storage section 119, a horizontal drive section 114, a system control section 115, and a signal processing section 118.

In the solid-state imaging device 101A, the pixel array section 111 is formed on a semiconductor substrate 11 (described later). A peripheral circuit, such as the vertical drive section 112, the column signal processing section 113, the data storage section 119, the horizontal drive section 114, the system control section 115, and the signal processing section 118, is formed, for example, on the same semiconductor substrate 11 as the pixel array section 111.

The pixel array section 111 includes a plurality of sensor pixels 110 each including a photoelectric conversion section 51 (described later) that generates and accumulates charges corresponding to an amount of light incident from the subject. As illustrated in FIG. 1, the sensor pixels 110 are arranged in each of a horizontal direction (row direction) and a vertical direction (column direction). In the pixel array section 111, pixel drive lines 116 are wired along the row direction for each pixel row including the sensor pixels 110 arranged in line in the row direction, whereas vertical signal lines (VSL) 117 are wired along the column direction for each pixel column including the sensor pixels 110 arranged in line in the column direction.

The vertical drive section 112 includes a shift register, an address decoder, and the like. The vertical drive section 112 supplies respective signals or the like to the plurality of sensor pixels 110 via the plurality of pixel drive lines 116, to thereby drive all of the plurality of sensor pixels 110 in the pixel array section 111 simultaneously or in a unit of pixel rows.

The vertical drive section 112 inputs a drive signal S58 to a discharge transistor (OFG) 58 described later to turn it ON, thereby bringing the photoelectric conversion section (PD) 51 described later and a power source VDD2 in each sensor pixel 110 into a conductive state. As a result, unnecessary charges are swept out of the PD 51. This is called reset. Thereafter, the vertical drive section 112 inputs the drive signal S58 to the OFG 58 to turn it OFF, thereby enabling exposure in each sensor pixel 110 to be started. After starting the exposure, the vertical drive section 112 inputs the drive signal S58 to a first transfer transistor (TG) 52A to switch the TG 52A from ON to OFF to thereby enable the charges generated and accumulated in the PD 51 to be transferred to a charge-holding section (MEM) 59. At a point in time when the transfer of charges from the PD 51 to the MEM 59 is completed, the exposure is finished.

Here, the OFF operation of the OFG 58 and the OFF operation of the TG 52A are performed simultaneously for all of the sensor pixels 110 in the pixel array section 111. This allows the exposure to be started and finished simultaneously in all of the sensor pixels 110 in the pixel array section 111.

A signal outputted from each unit pixel of a pixel row selected and scanned by the vertical drive section 112 is supplied to the column signal processing section 113 through each VSL 117. For each pixel column of the pixel array section 111, the column signal processing section 113 performs predetermined signal processing for the signal outputted from each unit pixel of the selected row through the VSL 117, and temporarily holds a pixel signal after the signal processing.

Specifically, the column signal processing section 113 includes, for example, a shift register, an address decoder, and the like, and performs noise cancellation processing, correlation double sampling processing, A/D (Analog/Digital) conversion A/D conversion processing of an analog pixel signal, or the like to generate a digital pixel signal. The column signal processing section 113 supplies the generated pixel signal to the signal processing section 118.

The horizontal drive section 114 is configured by a shift register, an address decoder, and the like, and sequentially selects a unit circuit corresponding to a pixel column of the column signal processing section 113. As a result of selective scanning by the horizontal drive section 114, a pixel signal having undergone signal processing for each unit circuit in the column signal processing section 113 is sequentially outputted to the signal processing section 118.

The system control section 115 includes a timing generator or the like that generates various timing signals. On the basis of timing signals generated by the timing generator, the system control section 115 performs drive control of the vertical drive section 112, the column signal processing section 113, and the horizontal drive section 114.

The signal processing section 118 performs signal processing such as arithmetic processing on the pixel signal supplied from the column signal processing section 113 while temporarily storing data in the data storage section 119 as necessary, and outputs an image signal including each pixel signal.

Upon the signal processing in the signal processing section 118, the data storage section 119 temporarily stores data necessary for the signal processing.

Figure 1B:
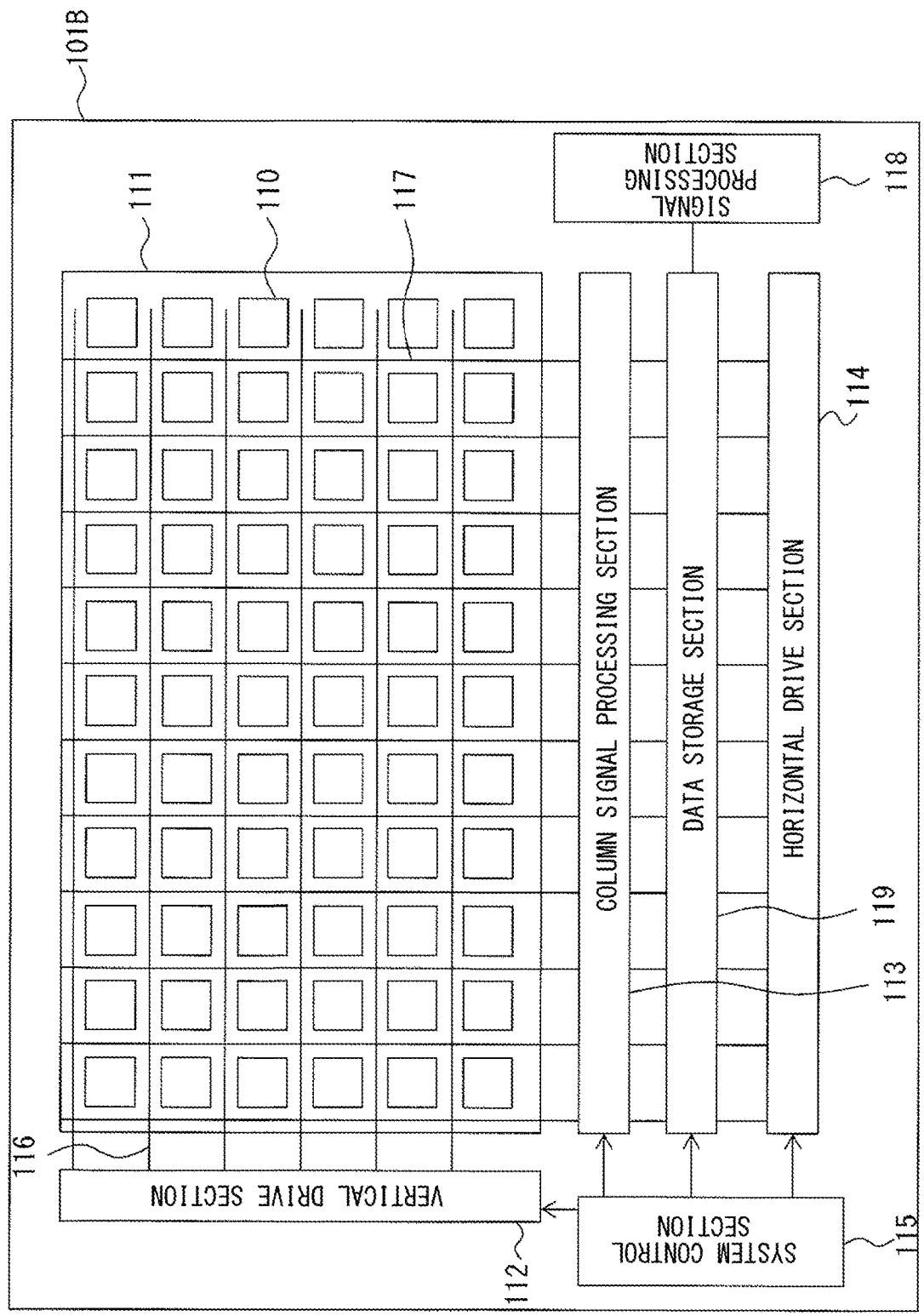
FIG. 1B is a block diagram illustrating a configuration example of functions of an imaging device as a first modification example of the first embodiment.

It is to be noted that the solid-state imaging device of the present technology is not limited to the solid-state imaging device 101A illustrated in FIG. 1A, and may have a configuration as in a solid-state imaging device 101B illustrated in FIG. 1B or a solid-state imaging device 101C illustrated in FIG. 1C, for example. FIG. 1B is a block diagram illustrating a configuration example of functions of the solid-state imaging device 101B as a first modification example according to the first embodiment of the present technology. FIG. 1C is a block diagram illustrating a configuration example of functions of the solid-state imaging device 101C as a second modification example according to the first embodiment of the present technology.

In the solid-state imaging device 101B of FIG. 1B, the data storage section 119 is disposed between the column signal processing section 113 and the horizontal drive section 114, and a pixel signal outputted from the column signal processing section 113 is supplied to the signal processing section 118 via the data storage section 119.

In addition, in the solid-state imaging device 101C of FIG. 1C, the data storage section 119 and the signal processing section 118 are disposed in parallel between the column signal processing section 113 and the horizontal drive section 114. In the solid-state imaging device 101C, the column signal processing section 113 performs A/D conversion for conversion of an analog pixel signal into a digital pixel signal for each column of the pixel array section 111 or for each plurality of columns of the pixel array section 111.

[Configuration of Sensor Pixel 110]
(Circuit Configuration Example)

Figure 2:
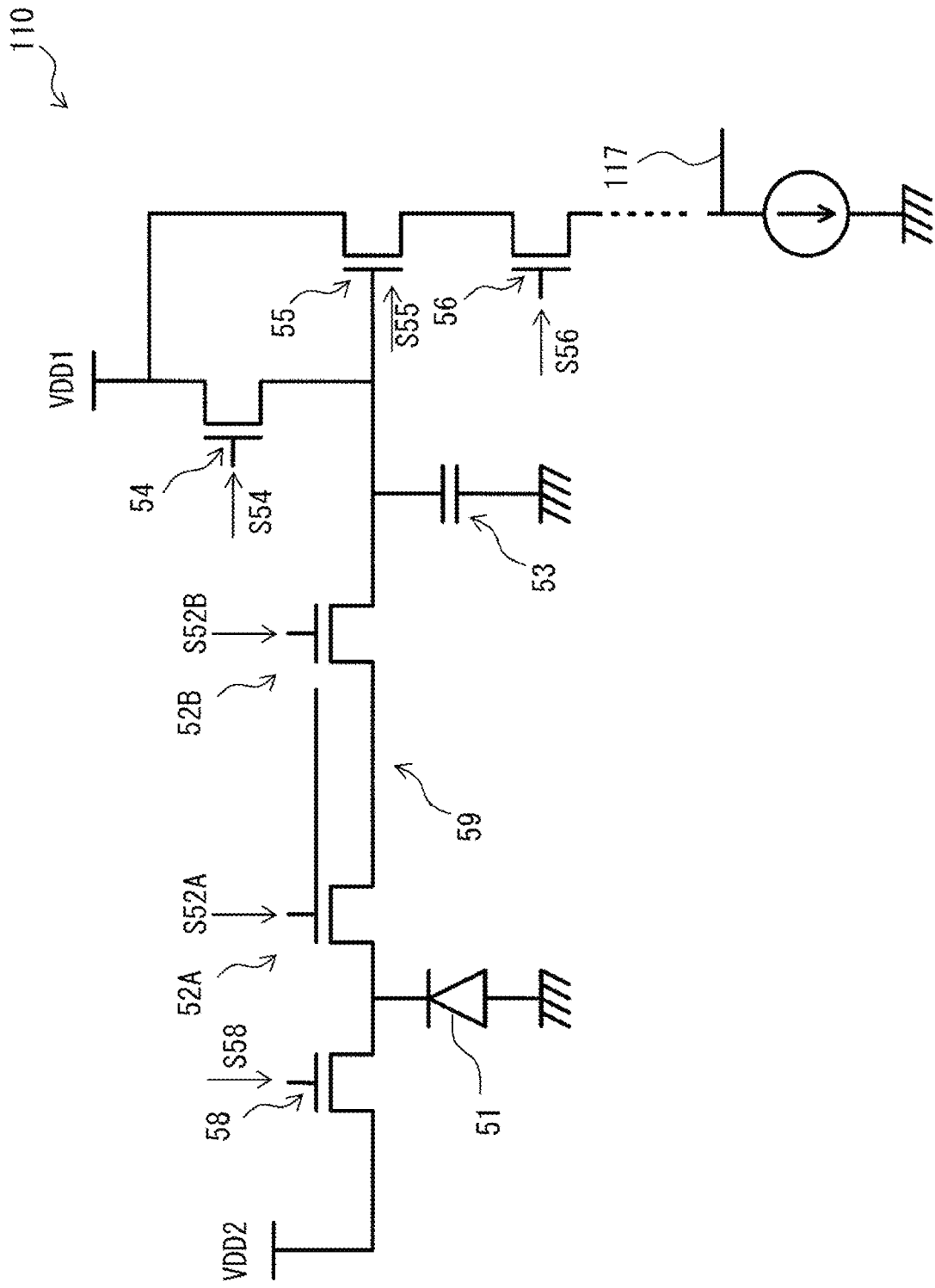
FIG. 2 is a circuit diagram illustrating a circuit configuration of one sensor pixel in the imaging device illustrated in FIG. 1A.

Next, description is given, with reference to FIG. 2, of a circuit configuration example of the sensor pixel 110 provided in the pixel array section 111 of FIG. 1A. FIG. 2 illustrates the circuit configuration example of one sensor pixel 110 of the plurality of sensor pixels 110 configuring the pixel array section 111.

In the example illustrated in FIG. 2, the sensor pixel 110 in the pixel array section 111 achieves a memory-holding global shutter. The sensor pixel 110 includes power sources VDD1 and VDD2, the photoelectric conversion section (PD) 51, a first transfer transistor (TG) 52A, a second transfer transistor (TG) 52B, a charge-voltage conversion section (FD) 53, a reset transistor (RST) 54, an amplification transistor (AMP) 55, a selection transistor (SEL) 56, a discharge transistor (OFG) 58, and the charge-holding section (MEM) 59.

In this example, the TGs 52A and 52B, the RST 54, the AMP 55, the SEL 56, and the OFG 58 are each an N-type MOS transistor. Drive signals S52A, S52B, S54, S55, S56, and S58 are each supplied to respective gate electrodes of the TGs 52A and 52B, the RST 54, the AMP 55, the SEL 56, and the OFG 58 by the vertical drive section 112 and the horizontal drive section 114 on the basis of the drive control of the system control section 115. The drive signals S52A, S52B, S54, S55, S56, and S58 are each a pulse signal in which a high-level state is an active state (ON state) and a low-level state is a non-active state (OFF state). It is to be noted that, hereinafter, bringing a drive signal into an active state is also referred to as turning a drive signal ON, and bringing a drive signal into a non-active state is also referred to as turning a drive signal OFF.

The PD 51 is, for example, a photoelectric conversion element including a P-N junction photodiode, and is configured to receive light from a subject and to generate and accumulate charges corresponding to an amount of the light reception by means of photoelectric conversion.

The MEM 59 is provided between the PD 51 and the FD 53; the MEM 59 is a region that temporarily holds charges generated and accumulated in the PD 51 until the charges are transferred to the FD 53 in order to achieve the global shutter function.

The TG 52A is disposed between the PD 51 and the MEM 59, and the TG 52B is disposed between the MEM 59 and the FD 53. The TG 52A is configured to transfer the charges accumulated in the PD 51 to the MEM 59 in response to the drive signal S52A applied to the gate electrode of the TG 52A. The TG 52B is configured to transfer the charges temporarily held in the MEM 59 to the FD 53 in response to the drive signal S52B applied to the gate electrode of the TG 52B. These TGs 52A and 52B are each a specific example corresponding to a "transfer section" of the present disclosure. In the sensor pixel 110, for example, when the drive signal S52A is turned OFF; the TG 52A is turned OFF; the drive signal S52B is turned ON; and the TG 52B is turned ON, the charges held in the MEM 59 are transferred to the FD 53 via the TG 52B.

The RST 54 has a drain coupled to the power source VDD1 and a source coupled to the FD 53. In response to the drive signal S54 to be applied to a gate electrode of the RST 54, the RST 54 initializes, i.e., resets the FD 53. For example, when the drive signal S54 is tuned ON and the RST 54 is turned ON, a potential of the FD 53 is reset to the voltage level of the power source VDD1. That is, the FD 53 is initialized.

The FD 53 is a floating diffusion region that converts charges transferred from the PD 51 via the TG 52A, the MEM 59, and the TG 52B into an electric signal (e.g., a voltage signal) and outputs the electric signal. The RST 54 is coupled to the FD 53, and the VSL 117 is coupled to the FD 53 via the AMP 55 and the SEL 56.

The AMP 55 outputs an electric signal according to a potential of the FD 53. The AMP 55 configures a source follower circuit with a constant current source provided in the column signal processing section 113, for example. The SEL 56 is turned ON when the sensor pixel 110 is selected, and outputs an electric signal from the FD 53 via the AMP 55, to the column signal processing section 113 through the VSL 117.

The sensor pixel 110 further includes the power source VDD2 in addition to the FD 53 as a transfer destination for the charges of the PD 51. The discharge transistor (OFG) 58 is disposed between the PD 51 and the VDD2.

The OFG 58 has a drain coupled to the power source VDD2 and a source coupled to a wiring line linking the TG 52A and the PD 51. The OFG 58 initializes, i.e., resets the PD 51 in response to the drive signal S58 applied to the gate electrode of the OFG 58. Resetting the PD 51 means depleting the PD 51.

In addition, the OFG 58 forms an overflow path between the TG 52A and the power source VDD2, and discharges charges overflowed from the PD 51 to the power source VDD2. In this manner, in the sensor pixel 110 of the present embodiment, the OFG 58 is able to reset the PD 51 directly.

(Planar Configuration Example and Cross-Sectional Configuration Example)

Figure 3:
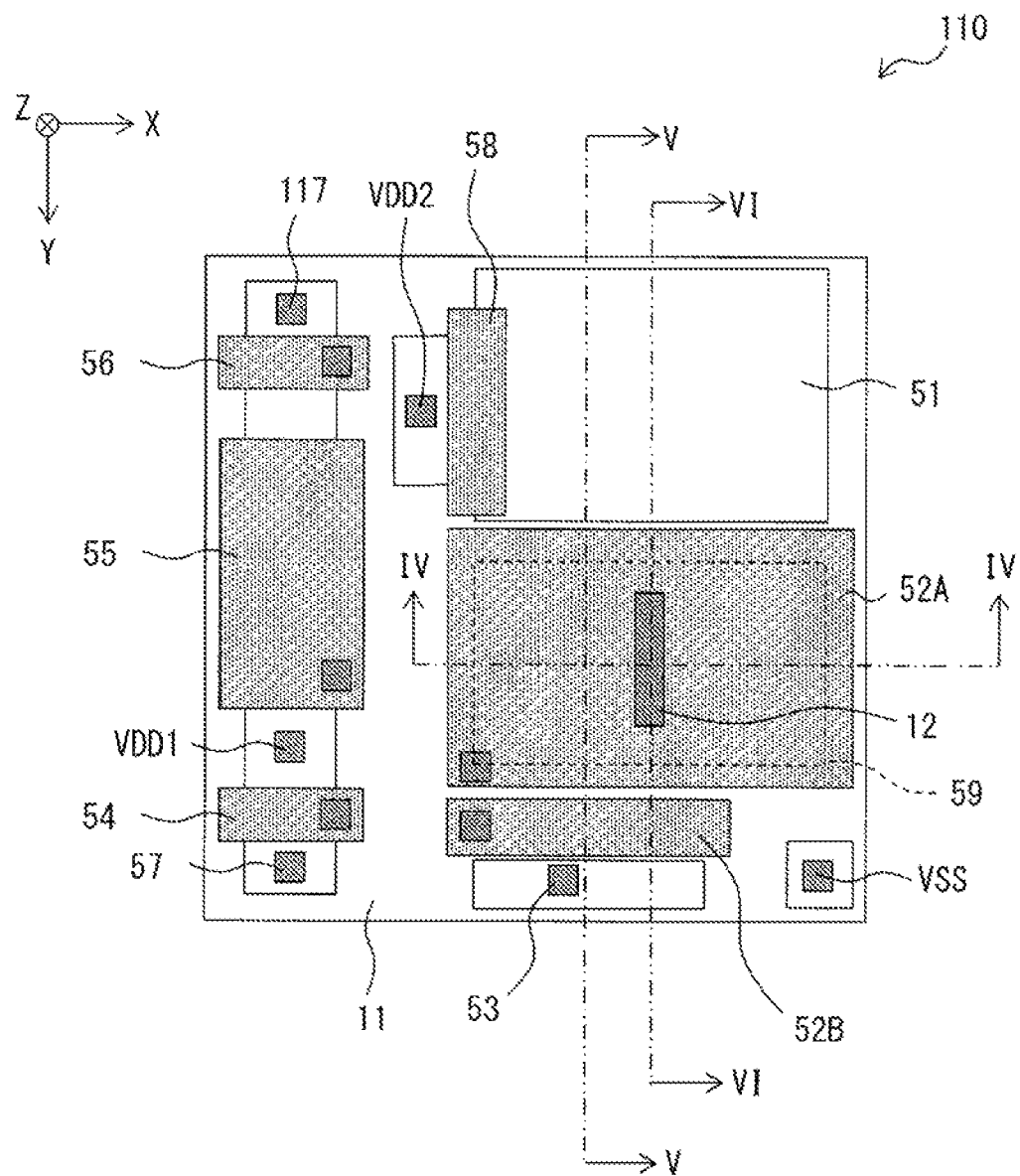
FIG. 3 is a plan view schematically illustrating the configuration of a portion of the sensor pixel in the imaging device illustrated in FIG. 1A.

Next, description is given, with reference to FIGS. 3 to 6, of a planar configuration example and a cross-sectional configuration example of the sensor pixel 110 provided in the pixel array section 111 of FIG. 1A. FIG. 3 illustrates a planar configuration example of one sensor pixel 110 of the plurality of sensor pixels 110 configuring the pixel array section 111. (A) of FIG. 4 illustrates a cross-sectional configuration example of one sensor pixel 110, and corresponds to a cross-section in a direction of an arrow taken along a cutting line IV-IV illustrated in FIG. 3. In addition, (B) of FIG. 4 illustrates a potential state of the sensor pixel 110 taken along the cutting line IV-IV. (A) of FIG. 5 illustrates a cross-sectional configuration example in a direction of an arrow taken along a cutting line V-V, and (B) of FIG. 5 illustrates a potential state of the sensor pixel 110 taken along the cutting line V-V. Further, (A) of FIG. 6 illustrates a cross-sectional configuration example in a direction of an arrow taken along a cutting line VI-VI, and (B) of FIG. 6 illustrates a potential state of the sensor pixel 110 taken along the cutting line VI-VI.

As illustrated in FIG. 3, (A) of FIG. 4, (A) of FIG. 5, and (A) of FIG. 6, the sensor pixel 110 includes the semiconductor substrate 11 formed by a semiconductor material such as Si (silicon), the PD 51, and the TGs 52A and 52B as transfer sections. Further, an insulating layer 13 including an oxide or the like is provided between the TGs 52A and 52B and the semiconductor substrate 11. The semiconductor substrate 11 includes a front surface 11S1 and a back surface 11S2 on side opposite to the front surface 11S1. The semiconductor substrate 11 may be provided with a light-shielding section in a manner to surround the PD 51.

It is to be noted, in the present embodiment, that, for example, the semiconductor substrate 11 is of a P-type (first electrically-conductive type) and the PD 51 and the MEM 59 are of an N-type (second electrically-conductive type).

As illustrated in FIG. 3, in the sensor pixel 110, the PD 51, the TG 52A, the TG 52B, and the FD 53 are arranged along a Y-axis direction parallel to the front surface 11S1. The RST 54, the VDD1, the AMP 55, the SEL 56, an FD 57, a VSS, and the VSL 117 are provided in a peripheral region of the sensor pixel 110. The OFG 58 is provided at a position overlapping the PD 51 in a Z-axis direction (also referred to as a thickness direction or a depth direction). The TG 52A is provided at a position overlapping the MEM 59 in the Z-axis direction. The FD 57 is coupled to the FD 53 by a metal layer. The VSS is a ground terminal, and is usually set to 0 V.

The sensor pixel 110 further includes, in the MEM 59, a trench section 12 extending in the thickness direction from the front surface 11S1 to the back surface 11S2. The trench section 12 includes a base 120, a P-type semiconductor layer 121 provided to cover the base 120, and an N-type semiconductor layer 122 provided to cover the semiconductor layer 121. Here, it is desirable that an impurity concentration of the semiconductor layer 122 (e.g., concentration of As (arsenic) or P (phosphorus)) be higher than an impurity concentration of the MEM 59. Further, it may be better for the trench section 12 to extend along a direction in which the PD 51, the MEM 59 and the FD 53 are arranged, i.e., along the Y-axis direction in which charges are transferred, as illustrated in FIG. 3. In addition, it may be better for the semiconductor layer 121 to be a P-type solid-phase diffusion layer and for the semiconductor layer 122 to be an N-type solid-phase diffusion layer. It is to be noted that, as described later, the solid-phase diffusion layer is obtained by performing solid-phase diffusion of P-type impurities or N-type impurities into the semiconductor substrate 11 by heat treatment or the like. For example, the semiconductor layer 121 is formed by doping of P-type impurities (B (boron), etc.) from a boundary between the base 120 and the semiconductor layer 121.

(Method of Forming Trench Section 12)

Next, description is given, with reference to FIG. 7A to 7E, of a method of forming the trench section 12 of the sensor pixel 110. The FIG. 7A to 7E are each an enlarged cross-sectional view of one step of a method of forming the trench section 12 of the sensor pixel 110 illustrated in FIG. 3.

First, as illustrated in FIG. 7A, a vertical groove 120V is formed that extends in the Z-axis direction at a predetermined position of the MEM 59. The vertical groove 120V is formed by digging down in the Z-axis direction from the front surface 11S1 by means of dry etching.

Next, as illustrated in FIG. 7B, an $SiO_2$ film 122Z containing P (phosphorus) as N-type impurities is formed to cover an inner surface of the vertical groove 120V, and thereafter heat treatment is performed to subject P (phosphorus) to solid-phase diffusion into the semiconductor substrate 11 from the $SiO_2$ film 122Z. This allows for formation of a solid-phase diffusion region 122A containing P (phosphorus).

Next, as illustrated in FIG. 7C, the $SiO_2$ film 122Z covering the inner surface of the vertical groove 120V is removed, and thereafter heat treatment is performed again. This allows for solid-phase diffusion of P (phosphorus) inside the semiconductor substrate 11, thus forming the semiconductor layer 122 as a self-aligned N-type solid-phase diffusion layer in a manner to follow a shape of the inner surface of the vertical groove 120V.

Next, as illustrated in FIG. 7D, an $SiO_2$ film 121Z containing B (boron) as P-type impurities is formed to cover the inner surface of the vertical groove 120V where the semiconductor layer 122 is formed, and thereafter heat treatment is performed to subject B (boron) to solid-phase diffusion into the semiconductor substrate 11 from the $SiO_2$ film 121Z. This allows for formation of the semiconductor layer 121, as a P-type solid-phase diffusion layer containing boron (B), inside the semiconductor layer 122.

Finally, as illustrated in FIG. 7E, the $SiO_2$ film 121Z is removed, and thereafter an inner space of the vertical groove 120V is filled with a filling material such as polysilicon to thereby form the base 120. As described above, the trench section 12 is completed.

(Operations of Sensor Pixel 110)

Next, description is given, with reference to FIGS. 2 to 6, of operations of the sensor pixel 110. In the sensor pixel 110, first, a high-level drive signal S56 is supplied to the OFG 58 before performing exposure, on the basis of the drive control of the system control section 115, thereby turning the OFG 58 ON. This allows the charges accumulated in the PD 51 to be discharged to the power source VDD2, thus causing the PD 51 to be reset.

After the PD 51 is reset, a low-level drive signal S56 is supplied to the OFG 58 on the basis of the drive control of the system control section 115, thereby turning the OFG 58 OFF. This allows the exposure to be started in all of the sensor pixels 110 in the pixel array section 111, thus causing charges to be generated and accumulated in each PD 51 having received light from a subject.

After elapse of predetermined exposure time, the drive signal S52A to the TG 52A is turned ON on the basis of the drive control of the system control section 115, in all of the sensor pixels 110 of the pixel array section 111. This causes, in each sensor pixel 110, the charges accumulated in the PD 51 to be transferred from the PD 51 to the MEM 59 via the TG 52A and to be temporarily held in the MEM 59.

Subsequently, on the basis of the drive control of the system control section 115, the drive signal S52A to the TG 52A is turned OFF, and thereafter a reading operation is performed for sequentially reading the charges held in the MEM 59 of each sensor pixel 110. The charge-reading operation is performed, for example, in a unit of row of the pixel array section 111; specifically, the TG 52B is turned ON by the drive signal S52B for each row to be read. This causes the charges held in the MEM 59 of each sensor pixel 110 to be transferred to the FD 53 in a unit of row.

Thereafter, when the SEL 56 is turned ON by the drive signal S56, an electric signal indicating a level corresponding to charges held in the FD 53 is outputted to the column signal processing section 113 through the VSL 117 sequentially via the AMP 55 and the SEL 56.

[Effects of Solid-State Imaging Device 101A]

As described above, in the sensor pixel 110 of the solid-state imaging device 101A of the present embodiment, the trench section 12 extending in the thickness direction (Z-axis direction) is provided in the N-type MEM 59 embedded in the P-type semiconductor substrate 11. Here, the trench section 12 includes the P-type semiconductor layer 121 that covers a front surface of the base 120. This increases an area of a boundary part between the P-type semiconductor layer and the N-type semiconductor layer by an amount of a surface area of the trench section 12, thus making it possible to increase a saturated charge amount in the MEM 59. As a result, it is possible to improve a dynamic range.

In addition, in the sensor pixel 110 of the present embodiment, the trench section 12 further includes the semiconductor layer 122 provided to cover the semiconductor layer 121. Further, the semiconductor layer 121 and the semiconductor layer 122 are each a solid-phase diffusion layer. Accordingly, a P-N junction having a steeper impurity-concentration profile is formed in the MEM 59, thus causing an electric field of the P-N junction to be stronger. This makes it possible to increase the saturated charge amount of the charge-holding section.

In addition, in the sensor pixel 110 of the present embodiment, the trench section 12 extends along a charge-transfer direction (Y-axis direction) in which the PD 51, the MEM 59, and the FD 53 are arranged. This allows for smooth transfer of charges from the PD 51 to the MEM 59 as well as smooth transfer of charges from the MEM 59 to the FD 53, as compared with a provisional case where the trench section 12 extends along an X-axis direction orthogonal to the charge-transfer direction (Y-axis direction). This improves operation reliability of the sensor pixel 110.

2. Modification Examples of First Embodiment

Third Modification Example

[Configuration of Sensor Pixel 110A]

FIG. 8 is a plan view illustrating the sensor pixel 110A as a third modification example of the first embodiment. In addition, (A) of FIG. 9 illustrates a cross-sectional configuration example of the sensor pixel 110A, and corresponds to a cross-section in a direction of an arrow taken along a cutting line IX-IX illustrated in FIG. 8. In addition, (B) of FIG. 9 illustrates a potential state of the sensor pixel 110A taken along the cutting line IX-IX. It is to be noted that FIG. 8 corresponds to FIG. 3 of the first embodiment, and FIG. 9 corresponds to FIG. 4 of the first embodiment.

As illustrated in FIGS. 8 and 9, the sensor pixel 110A as the third modification example is provided with a plurality of trench sections 12 (12A to 12C) in the MEM 59. The plurality of trench sections 12A to 12C are wall-like members extending in each of the Y-axis direction and the Z-axis direction, and are arranged to be aligned in the X-axis direction. Except for this point, the sensor pixel 110A has substantially the same configuration as that of the sensor pixel 110 as the foregoing first embodiment.

[Workings and Effects of Sensor Pixel 110A]

As described above, according to the sensor pixel 110A as the third modification example, the number of the trench section 12 is larger than that of the sensor pixel 110 according to the foregoing first embodiment. Accordingly, the sum of the surface area of the trench section 12 is increased, thus further increasing an area of a boundary part between the P-type semiconductor layer and the N-type semiconductor layer. This makes it possible to further increase the saturated charge amount in the MEM 59.

Fourth Modification Example

[Configuration of Sensor Pixel 110B]

FIG. 10 is a plan view illustrating a sensor pixel 110B as a fourth modification example of the first embodiment. In addition, (A) of FIG. 11 illustrates a cross-sectional configuration example of the sensor pixel 110B, and corresponds to a cross-section in a direction of an arrow taken along a cutting line XI-XI illustrated in FIG. 10. In addition, (B) of FIG. 11 illustrates a potential state of the sensor pixel 110B taken along the cutting line XI-XI. It is to be noted that FIG. 10 corresponds to FIG. 3 of the first embodiment, and FIG. 11 corresponds to FIG. 4 of the first embodiment.

As illustrated in FIGS. 10 and 11, the sensor pixel 110B as the fourth modification example is provided with a transfer transistor (TG) 61, as a transfer section, instead of the TG 52A. The TG 61 includes a trench gate section 62 provided to be adjacent to the trench section 12 and extending in the thickness direction. The sensor pixel 110B may include, for example, the plurality of trench sections 12 and a plurality of trench gate sections 62, and, for example, the plurality of trench sections 12 and the plurality of trench gate sections 62 may be arranged alternately in the X-axis direction. In the configuration example illustrated in FIGS. 10 and 11, the sensor pixel 110B includes two trench gate sections 62 in a manner to be opposed to each other, with the trench section 12 interposed therebetween in the X-axis direction. However, the number and arrangement positions of the trench gate section 62 are not limited to the embodiment illustrated in FIGS. 10 and 11, and may be optionally set. A front surface of the trench gate section 62 is covered with the insulating layer 13, and a P-type semiconductor region is interposed between the insulating layer 13 and an N-type semiconductor region configuring the MEM 59. Except for this point, the sensor pixel 110B has substantially the same configuration as that of the sensor pixel 110 as the foregoing first embodiment.

[Workings and Effects of Sensor Pixel 110B]

As described above, according to the sensor pixel 110B as the fourth modification example, the TG 61 is provided that includes the trench gate section 62 extending in the thickness direction, thus making it possible to apply a bias voltage to the semiconductor substrate 11. Consequently, it is possible to modulate the potential state in the semiconductor substrate 11, thus making it possible to smoothly transfer charges from the PD 51 over to the FD 53 through the MEM 59.

Fifth Modification Example

[Configuration of Sensor Pixel 110C]

FIG. 12 is a plan view illustrating a sensor pixel 110C as a fifth modification example of the first embodiment. In addition, (A) of FIG. 13 illustrates a cross-sectional configuration example of the sensor pixel 110C, and corresponds to a cross-section in a direction of an arrow taken along a cutting line XIII-XIII illustrated in FIG. 12. In addition, (B) of FIG. 13 illustrates a potential state of the sensor pixel 110C taken along the cutting line XIII-XIII. It is to be noted that FIG. 12 corresponds to FIG. 3 of the first embodiment, and FIG. 13 corresponds to FIG. 4 of the first embodiment.

As illustrated in FIGS. 12 and 13, the sensor pixel 110C as the fifth modification example further includes a plate section 63 provided on a bottom surface of the MEM 59 and extending in an X-Y in-plane direction orthogonal to the thickness direction. The plate section 63 includes a base 630, a P-type semiconductor layer 631 provided to cover the base 630, and an N-type semiconductor layer 632 provided to cover the semiconductor layer 631. In addition, it may be better for the semiconductor layer 631 to be a P-type solid-phase diffusion layer and for the semiconductor layer 632 to be an N-type solid-phase diffusion layer. Further, in the sensor pixel 110C, the trench section 12 and the plate section 63 are in contact with each other. Except for these points, the sensor pixel 110C has substantially the same configuration as that of the sensor pixel 110 as the foregoing first embodiment.

[Workings and Effects of Sensor Pixel 110C]

As described above, according to the sensor pixel 110C as the fifth modification example, the plate section 63 is further provided that is in contact with the trench section 12 and includes the P-type semiconductor layer 631 covering the base 630 and the N-type semiconductor layer 632. This increases an area of a boundary part between the P-type semiconductor layer and the N-type semiconductor layer by an amount of a surface area of the plate section 63 as compared with the sensor pixel 110 according to the foregoing first embodiment. Thus, it is possible to further increase the saturated charge amount in the MEM 59.

Sixth Modification Example

[Configuration of Sensor Pixel 110D]

FIG. 14 is a plan view illustrating a sensor pixel 110D as a sixth modification example of the first embodiment. In addition, (A) of FIG. 15 illustrates a cross-sectional configuration example of the sensor pixel 110D, and corresponds to a cross-section in a direction of an arrow taken along a cutting line XV-XV illustrated in FIG. 12. In addition, (B) of FIG. 15 illustrates a potential state of the sensor pixel 110D taken along the cutting line XV-XV. It is to be noted that FIG. 14 corresponds to FIG. 3 of the first embodiment, and FIG. 15 corresponds to FIG. 4 of the first embodiment.

As illustrated in FIGS. 14 and 15, the sensor pixel 110D as the sixth modification example includes, in addition to the trench section 12, two additional trench sections 21 provided in an element separation section that separates from another adjacent sensor pixel 110D. The trench section 21 includes a base 210, a P-type semiconductor layer 211 provided to cover the base 210, and an N-type semiconductor layer 212 provided to cover the semiconductor layer 211. It is to be noted that it may be better for the semiconductor layer 211 to be a P-type solid-phase diffusion layer and for the semiconductor layer 212 to be an N-type solid-phase diffusion layer. Except for this point, the sensor pixel 110D has substantially the same configuration as that of the sensor pixel 110B (FIGS. 10 and 11) as the foregoing fourth modification example.

[Workings and Effects of Sensor Pixel 110D]

As described above, according to the sensor pixel 110D as the sixth modification example, the sensor pixel 110D is provided with the TG 61 including the trench gate section 62 extending in the thickness direction, thus making it possible to apply a bias voltage to the semiconductor substrate 11. As a result, it is possible to modulate the potential state in the semiconductor substrate 11, thus making it possible to smoothly transfer charges from the PD 51 over to the FD 53 through the MEM 59. Moreover, the sensor pixel 110D includes the two additional trench sections 21, thus increasing an area of a boundary part between the P-type semiconductor layer and the N-type semiconductor layer by an amount of a surface area of the two trench sections 21 as compared with the sensor pixel 110 according to the foregoing first embodiment. Thus, it is possible to further increase the saturated charge amount in the MEM 59.

Seventh Modification Example

[Configuration of Sensor Pixel 110E]

FIG. 16 is a plan view illustrating a sensor pixel 110E as a seventh modification example of the first embodiment. In addition, (A) of FIG. 17 illustrates a cross-sectional configuration example of the sensor pixel 110E, and corresponds to a cross-section in a direction of an arrow taken along a cutting line XVII-XVII illustrated in FIG. 16. In addition, (B) of FIG. 17 illustrates a potential state of the sensor pixel 110E taken along the cutting line XVII-XVII. It is to be noted that FIG. 16 corresponds to FIG. 3 of the first embodiment, and FIG. 17 corresponds to FIG. 4 of the first embodiment.

As illustrated in FIGS. 16 and 17, the sensor pixel 110E as the seventh modification example includes another trench section 22 instead of a portion of the trench sections 21 provided in an element separation section. The trench section 22 includes a base 220, a P-type semiconductor layer 221 provided to cover the base 220, and an N-type semiconductor layer 222 provided to cover the semiconductor layer 221. At least the P-type semiconductor layer 221 of the trench section 22 is provided to penetrate the semiconductor substrate 11 in the thickness direction in a manner to be continuous from the front surface 11S1 to the back surface 11S2 of the semiconductor substrate 11. Further, as illustrated in FIG. 16, the trench section 22 is not only provided in the N-type semiconductor region configuring the MEM 59; but also provided to surround a portion of an N-type semiconductor region configuring the PD 51. Except for these points, the sensor pixel 110E has substantially the same configuration as that of the sensor pixel 110D (FIGS. 14 and 15) as the foregoing sixth modification example.

It is to be noted that the N-type semiconductor region configuring the PD 51 is formed to a deeper position in the Z-axis direction than the N-type semiconductor region configuring the MEM 59. In the sensor pixel 110E, the trench section 22 including the P-N junction is provided to face all of the N-type semiconductor regions configuring the PD 51 in the Z-axis direction, thus making it possible to increase the saturated charge amount in the MEM 59. Moreover, an effect is expectable of suppressing blooming from the PD 51 to the MEM 59 in another adjacent sensor pixel 110E. One reason for this is that the trench section 22 formed to a deeper position separates the PD 51 of the sensor pixel 110E and the MEM 59 of another adjacent sensor pixel 110E from each other.

Eighth Modification Example

[Configuration of Sensor Pixel 110F]

FIG. 18 is a plan view illustrating a sensor pixel 110F as an eighth modification example of the first embodiment. In addition, (A) of FIG. 19 illustrates a cross-sectional configuration example of the sensor pixel 110F, and corresponds to a cross-section in a direction of an arrow taken along a cutting line XIX-XIX illustrated in FIG. 18. In addition, (B) of FIG. 19 illustrates a potential state of the sensor pixel 110F taken along the cutting line XIX-XIX. It is to be noted that FIG. 18 corresponds to FIG. 3 of the first embodiment, and FIG. 19 corresponds to FIG. 4 of the first embodiment.

As illustrated in FIGS. 18 and 19, the sensor pixel 110F of the eighth modification example includes no trench section 12, but includes two additional trench sections 21 provided in an element separation section that separates from another adjacent sensor pixel 110D. Except for this point, the sensor pixel 110F has substantially the same configuration as that of the sensor pixel 110D (FIGS. 14 and 15) as the foregoing sixth modification example. In the sensor pixel 110F as the eighth modification example, two trench gate sections 62 in The TG 61 are arranged to be opposed to each other. This increases modulating force between the two trench gate sections 62, i.e., a variation amount of a potential at a time when the TG 61 is turned ON, thus allowing the transfer from the PD 51 to the MEM 59 to be performed more favorably.

Ninth Modification Example

[Configuration of Sensor Pixel 110G]

FIG. 20 is a plan view illustrating a sensor pixel 110G as a ninth modification example of the first embodiment. In addition, (A) of FIG. 21 illustrates a cross-sectional configuration example of the sensor pixel 110G, and corresponds to a cross-section in a direction of an arrow taken along a cutting line XXI-XXI illustrated in FIG. 20. In addition, (B) of FIG. 21 illustrates a potential state of the sensor pixel 110G taken along the cutting line XXI-XXI. It is to be noted that FIG. 20 corresponds to FIG. 3 of the first embodiment, and FIG. 21 corresponds to FIG. 4 of the first embodiment.

As illustrated in FIGS. 20 and 21, the sensor pixel 110G as the ninth modification example includes no trench section 12, but includes two additional trench sections 21 provided in an element separation section that separates from another adjacent sensor pixel 110D. The sensor pixel 110 G further includes the plate section 63 provided on a bottom surface of the MEM 59 and extending in the X-Y in-plane direction. The plate section 63 is coupled to each of the two trench sections 21. Except for these points, the sensor pixel 110G has substantially the same configuration as that of the sensor pixel 110 as the foregoing first embodiment.

[Workings and Effects of Sensor Pixel 110G]

As described above, the sensor pixel 110G as the ninth modification example is provided with the plate section 63. This increases an area of a boundary part between the P-type semiconductor layer and the N-type semiconductor layer by an amount of a surface area of the plate section 63 as compared with the sensor pixel 110 according to the foregoing first embodiment. Thus, it is possible to further increase the saturated charge amount in the MEM 59. In addition, the trench section 21 including the P-N junction is provided in the element separation section, thus making it possible to effectively utilize space, which is advantageous for a reduction in size of the solid-state imaging device 101A.

Tenth Modification Example

[Configuration of Sensor Pixel 110H]

FIG. 22 is a plan view illustrating a sensor pixel 110H as a tenth modification example of the first embodiment. In addition, (A) of FIG. 23 illustrates a cross-sectional configuration example of the sensor pixel 110H, and corresponds to a cross-section in a direction of an arrow taken along a cutting line XXIII-XXIII illustrated in FIG. 22. In addition, (B) of FIG. 23 illustrates a potential state of the sensor pixel 110H taken along the cutting line XXIII-XXIII. It is to be noted that FIG. 22 corresponds to FIG. 3 of the first embodiment, and FIG. 23 corresponds to FIG. 4 of the first embodiment.

As illustrated in FIGS. 22 and 23, the sensor pixel 110H as the tenth modification example includes the TG 61, as a transfer section, instead of the TG 52A. The TG 61 includes the trench gate section 62 provided between two trench sections 2112 and extending in the thickness direction. A front surface of the trench gate section 62 is covered with the insulating layer 13, and a P-type semiconductor region is interposed between the insulating layer 13 and an N-type semiconductor region configuring the MEM 59. Except for this point, the sensor pixel 110H has substantially the same configuration as that of the sensor pixel 110G as the foregoing ninth modification example.

[Workings and Effects of Sensor Pixel 110H]

As described above, according to the sensor pixel 110H as the tenth modification example, the TG 61 is provided that includes the trench gate section 62 extending in the thickness direction, thus making it possible to apply a bias voltage to the semiconductor substrate 11. As a result, it is possible to modulate the potential state in the semiconductor substrate 11, thus making it possible to smoothly transfer charges from the PD 51 over to the FD 53 through the MEM 59. In addition, the sensor pixel 110H includes the plate section 63. This increases an area of a boundary part between the P-type semiconductor layer and the N-type semiconductor layer by an amount of a surface area of the plate section 63 as compared with the sensor pixel 110 according to the foregoing first embodiment. Thus, it is possible to further increase the saturated charge amount in the MEM 59. In addition, the trench section 21 including the P-N junction is provided in the element separation section, thus making it possible to effectively utilize space, which is advantageous for a reduction in size of the solid-state imaging device 101A.

Eleventh Modification Example

[Configuration of Sensor Pixel 110J]

FIG. 24 is a plan view illustrating a sensor pixel 110J as an eleventh modification example of the first embodiment. In addition, (A) of FIG. 25 illustrates a cross-sectional configuration example of the sensor pixel 110J, and corresponds to a cross-section in a direction of an arrow taken along a cutting line XXV-XXV illustrated in FIG. 24. In addition, (B) of FIG. 24 illustrates a potential state of the sensor pixel 110J taken along the cutting line XXV-XXV. It is to be noted that FIG. 24 corresponds to FIG. 3 of the first embodiment, and FIG. 25 corresponds to FIG. 4 of the first embodiment.

As illustrated in FIGS. 24 and 25, the sensor pixel 110J as the eleventh modification example further includes the plate section 63 provided on a bottom surface of the MEM 59 and extending in the X-Y in-plane direction orthogonal to the thickness direction. The plate section 63 includes the base 630, the P-type semiconductor layer 631 provided to cover the base 630, and the N-type semiconductor layer 632 provided to cover the semiconductor layer 631. Further, in the sensor pixel 110J, the trench section 12 and the plate section 63 are in contact with each other, and the two trench sections 21 and the plate section 63 are in contact with each other. Except for these points, the sensor pixel 110J has substantially the same configuration as that of the sensor pixel 110D as the foregoing sixth modification example.

[Workings and Effects of Sensor Pixel 110J]

As described above, according to the sensor pixel 110J as the eleventh modification example, the plate section 63 is further provided that is in contact with each of the trench sections 12 and 21 and includes the P-type semiconductor layer 631 covering the base 630 and the N-type semiconductor layer 632. This increases an area of a boundary part between the P-type semiconductor layer and the N-type semiconductor layer by an amount of a surface area of the plate section 63 as compared with the sensor pixel 110D as the foregoing sixth modification example. Thus, it is possible to further increase the saturated charge amount in the MEM 59.

Twelfth Modification Example

FIG. 26 is a schematic cross-sectional view of a sensor pixel 110K as a twelfth modification example of the first embodiment. In the present disclosure, as in the sensor pixel 110K, a trench section 12A may be provided that includes the semiconductor layer 121 covering a front surface of the base 120. That is, the trench section 12A including no semiconductor layer 122 may be provided instead of the trench section 12.

Thirteenth Modification Example

FIG. 27 is a schematic cross-sectional view of a sensor pixel 110L as a thirteenth modification example of the first embodiment. In the present disclosure, as in the sensor pixel 110L, at least the semiconductor layer 121 of the trench section 12 may be provided to penetrate the semiconductor substrate 11 from the front surface 11S1 to the back surface 11S2.

Fourteenth Modification Example

FIG. 28 is a schematic cross-sectional view of a sensor pixel 110M as a fourteenth modification example of the first embodiment. In the present disclosure, as in the sensor pixel 110M, at least the semiconductor layer 121 of the trench section 12 may be exposed to the back surface 11S2 of the semiconductor substrate 11, and may extend halfway from the back surface 11S2 toward the front surface 11S1.

It is to be noted that the sensor pixel 110 of the foregoing first embodiment and the sensor pixels 110A to 110M as the first to fourteenth modification examples are each applicable to both of a front-side illumination type solid-state imaging device and a backside illumination type solid-state imaging device.

3. Second Embodiment

FIG. 29 illustrates a planar configuration example of a sensor pixel 200 according to a second embodiment of the present disclosure. In addition, FIG. 30 illustrates a circuit configuration example of the sensor pixel 200. Further, FIG. 31 illustrates a cross-sectional configuration example of the sensor pixel 200 in a direction of an arrow taken along a cutting line XXXI-XXXI illustrated in FIG. 29. Further, FIG. 32 illustrates a cross-sectional configuration example of the sensor pixel 200 in a direction of an arrow taken along a cutting line XXXII-XXXII illustrated in FIG. 29. However, in FIG. 32, a region between a position P1 and a position P2 indicates an X-Z cross-section along the X-axis direction, and a region between the position P2 and a position P3 indicates a Y-Z cross-section along the Y-axis direction.

In the sensor pixel 110 of the foregoing first embodiment, the PD 51 and the MEM 59 are arranged to be adjacent to each other in the X-Y plane. In contrast, in the sensor pixel 200 of the present embodiment, the PD 51 and the MEM 59 are stacked in the thickness direction (Z-axis direction). More specifically, the PD 51 is arranged on side of the back surface 11S2 of the semiconductor substrate 11, and the MEM 59 is arranged on side of the front surface 11S1 of the semiconductor substrate 11. The sensor pixel 200 further includes, between the PD 51 and the MEM 59, a buffer region 70 that temporarily holds charges (FIGS. 30 and 32). The sensor pixel 200 is provided with a transfer transistor (TG) 52C between the PD 51 and the buffer region 70. As illustrated in FIG. 31, the TG 52C is provided on the front surface 11S1, and includes a trench gate extending in the Z-axis direction to reach the PD 52. In the sensor pixel 200, the TG 52C is turned ON, thereby causing charges to be transferred from the PD 51 to the buffer region 70 positioned in the vicinity of the front surface 11S1. At that time, the TG 61 is turned ON together, and thereafter the TG 52C is turned OFF before the TG 61 is turned OFF, thereby causing the charges of the buffer region 70 having been transferred from the PD 51 to be transferred to the MEM 59. It is to be noted that the TG 52C and the OFG 58 are turned ON simultaneously, and thereafter the TG 52C is turned OFF before the OFG 58 is turned OFF, thereby enabling unnecessary charges to be discharged from the PD 51 to the VDD2.

The sensor pixel 200 further includes a plate section 73 extending in the X-Y in-plane direction between the PD 51 and the MEM 59 that overlap each other in the Z-axis direction. The plate section 73 includes a base 730, a P-type semiconductor layer 731 provided to cover the base 730, and an N-type semiconductor layer 732 provided to cover the semiconductor layer 731. It may be better for the base 730 to include, for example, a metal material having a superior light-shielding property, such as aluminum. In addition, it may be better for the semiconductor layer 731 to be a P-type solid-phase diffusion layer and for the semiconductor layer 732 to be an N-type solid-phase diffusion layer.

The MEM 59 of the sensor pixel 200 includes a plurality of wall-like trench sections 71 extending in each of the Z-axis direction and the Y-axis direction. The trench section 71 includes a base 710, a P-type semiconductor layer 711 provided to cover the base 710, and an N-type semiconductor layer 712 provided to cover the semiconductor layer 711. Each of the plurality of trench sections 71 is in contact with the plate section 73. In addition, it may be better for the semiconductor layer 711 to be a P-type solid-phase diffusion layer and for the semiconductor layer 712 to be an N-type solid-phase diffusion layer.

The sensor pixel 200 includes the TG 61. The TG 61 includes the trench gate section 62 provided to be adjacent to the trench section 71 in the X-axis direction and extending in the thickness direction.

The sensor pixel 200 further includes a trench section 72 provided along an outer edge of the sensor pixel 200 and provided in an element separation section that separates from another adjacent sensor pixel 200. The trench section 72 includes a base 720, a P-type semiconductor layer 721 provided to cover the base 720, and an N-type semiconductor layer 722 provided to cover the semiconductor layer 721. In addition, it may be better for the semiconductor layer 721 to be a P-type solid-phase diffusion layer and for the semiconductor layer 722 to be an N-type solid-phase diffusion layer.

As described above, also in the sensor pixel 200 of the present embodiment, the MEM 59 is provided with the trench section 71, the trench section 72, and the plate section 73. This increases an area of the P-N junction, thus making it possible to increase the saturated charge amount in the MEM 59. In particular, in a case where the plate section 73 provided between the PD 51 and the MEM 59 is configured by a material having a light-shielding property, it is possible to suppress light incidence on the MEM 59, thus making it possible to reduce noise. This improves PLS (Parasitic Light Sensitivity) characteristics.

4. Example of Application to Electronic Apparatus

FIG. 33 is a block diagram illustrating a configuration example of a camera 2000 as an electronic apparatus to which the present technology is applied.

The camera 2000 includes an optical unit 2001 including a lens group or the like, an imaging device (imaging device) 2002 to which the above-described solid-state imaging device 101 or the like (hereinafter, referred to as the solid-state imaging device 101, etc.) is applied, and a DSP (Digital Signal Processor) circuit 2003 that is a camera signal processing circuit. In addition, the camera 2000 also includes a frame memory 2004, a display unit 2005, a recording unit 2006, an operation unit 2007, and a power source unit 2008. The DSP circuit 2003, the frame memory 2004, the display unit 2005, the recording unit 2006, the operation unit 2007, and the power source unit 2008 are coupled to one another via a bus line 2009.

The optical unit 2001 takes in incident light (image light) from a subject to form an image on an imaging surface of the imaging device 2002. The imaging device 2002 converts a light amount of the incident light formed, as an image, on the imaging surface by the optical unit 2001 into an electric signal on a pixel unit basis, and outputs the converted electric signal as a pixel signal.

The display unit 2005 includes, for example, a panel-type display device such as a liquid crystal panel or an organic EL panel, and displays a moving image or a still image captured by the imaging device 2002. The recording unit 2006 records the moving image or the still image captured by the imaging device 2002 in a recording medium such as a hard disk or a semiconductor memory.

The operation unit 2007 issues an operation command for various functions of the camera 2000 under the operation of a user. The power source unit 2008 appropriately supplies various types of power for operation to the DSP circuit 2003, the frame memory 2004, the display unit 2005, the recording unit 2006, and the operation unit 2007 which are supply targets.

As described above, obtainment of a favorable image is expectable by using the above-described solid-state imaging device 101A, etc. as the imaging device 2002.

5. Example of Practical Application to Mobile Body

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 34, an audio speaker 12061, a display section 12062, and an instrument panel 12063 are illustrated as the output device. The display section 12062 may, for example, include at least one of an on-board display and a head-up display.

FIG. 35 is a diagram depicting an example of the installation position of the imaging section 12031.

In FIG. 35, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the foregoing, the description has been given of one example of the vehicle control system, to which the technology according to an embodiment of the present disclosure may be applied. The technology according to an embodiment of the present disclosure may be applied to the imaging section 12031 among components of the configuration described above. Specifically, the solid-state imaging device 101A, etc. illustrated in FIG. 1 and other drawings is applicable to the imaging section 12031. A superior operation of the vehicle control system is expectable by application of the technology according to an embodiment of the present disclosure to the imaging section 12031.

6. Other Modification Examples

Although the description has been given hereinabove of the present disclosure with reference to the several embodiments and the modification examples, the present disclosure is not limited to the foregoing embodiments, etc., and various modifications may be made. For example, although the description has been given, in the first embodiment, etc., by exemplifying the backside illumination type image sensor of the global shutter system, the imaging device of the present disclosure is not limited to the backside illumination type image sensor, and is applicable to a front-side illumination type image sensor.

In addition, the imaging device of the present disclosure may be in a form of a module in which an imaging section and a signal processing section or an optical system are packaged together.

In addition, the foregoing embodiments, etc. have exemplified the sensor pixel including, as a transfer section, two or three transfer transistors separated from each other; however, the imaging device of the present disclosure may also include four or more transfer transistors as the transfer section.

According to the imaging device and the electronic apparatus as an embodiment of the present disclosure, it is possible to increase the saturated charge amount of the charge-holding section, thus making it possible to achieve superior imaging performance such as expansion of dynamic range. It is to be noted that the effects of the present disclosure are not limited thereto, and may be any of the effects described herein.

It is to be noted that the effects described herein are merely exemplary and are not limited thereto, and may have other effects. In addition, the present technology may have the following configurations.

(1)
An imaging device including:
a semiconductor substrate of a first electrically-conductive type including a first surface and a second surface on side opposite to the first surface;
a photoelectric conversion section of a second electrically-conductive type embedded in the semiconductor substrate and generating charges corresponding to an amount of light reception by means of photoelectric conversion;
a charge-holding section of the second electrically-conductive type embedded in the semiconductor substrate and holding the charges generated in the photoelectric conversion section;
a transfer section that transfers the charges from the photoelectric conversion section to a transfer destination; and
a trench section extending in a thickness direction from the first surface toward the second surface in the charge-holding section,
the trench section including a first base and a first semiconductor layer of the first electrically-conductive type provided to cover the first base.

(2)
The imaging device according to (1), in which the trench section further includes a second semiconductor layer of the second electrically-conductive type provided to cover the first semiconductor layer and having an impurity concentration higher than an impurity concentration of the charge-holding section.

(3)
The imaging device according to (1) or (2), further including a charge-voltage conversion section as the transfer destination to which the charges are transferred from the charge-holding section, in which
the trench section further extends in a first direction orthogonal to the thickness direction, and
the charge-holding section and the charge-voltage conversion section are arranged along the first direction.

(4)
The imaging device according to (3), in which the photoelectric conversion section and the charge-holding section are arranged along the first direction.

(5)
The imaging device according to any one of (1) to (4), in which the trench section includes a plurality of trench sections.

(6)
The imaging device according to (5), in which the trench section of a portion of the plurality of trench sections penetrates the semiconductor substrate from the first surface to the second surface.

(7)
The imaging device according to any one of (1) to (6), in which the transfer section includes a trench gate section provided to be adjacent to the trench section and extending in the thickness direction.

(8)
The imaging device according to (7), in which
the trench section includes a plurality of trench sections,
the transfer section includes a plurality of the trench gate sections, and
the plurality of trench sections and the plurality of the trench gate sections are arranged alternately in a direction orthogonal to the thickness direction.

(9)
The imaging device according to any one of (1) to (8), further including a plate section provided on a bottom surface of the charge-holding section and extending in an in-plane direction orthogonal to the thickness direction, in which the plate section includes a second base, a third semiconductor layer of the first electrically-conductive type provided to cover the second base, and a fourth semiconductor layer of the second electrically-conductive type provided to cover the third semiconductor layer.

(10)

The imaging device according to (9), in which the trench section and the plate section are in contact with each other.

(11)

The imaging device according to claim 1, in which the photoelectric conversion section and the charge-holding section are stacked in the thickness direction from the second surface toward the first surface.

(12)

The imaging device according to (1) or (2), further including a plate section extending in an in-plane direction orthogonal to the thickness direction between the photoelectric conversion section and the charge-holding section, in which the plate section includes a second base, a third semiconductor layer of the first electrically-conductive type provided to cover the second base, and a fourth semiconductor layer of the second electrically-conductive type provided to cover the third semiconductor layer.

(13)

The imaging device according to (12), in which the second base in the plate section includes a metal material.

(14)

The imaging device according to (2), in which the first semiconductor layer includes a first electrically-conductive type solid-phase diffusion layer, and the second semiconductor layer includes a second electrically-conductive type solid-phase diffusion layer.

(15)

The imaging device according to any one of (1) to (14), in which the trench section is exposed to the first surface.

(16)

The imaging device according to any one of (1) to (15), in which the semiconductor substrate includes a plurality of pixels, and the trench section is provided in an element separation section that separates the plurality of pixels from one another.

(17)

The imaging device according to any one of (1) to (16), in which the first semiconductor layer is formed by doping of an impurity from a boundary between the first base and the first semiconductor layer.

(18)

An electronic apparatus including an imaging device, the imaging device including a semiconductor substrate of a first electrically-conductive type including a first surface and a second surface on side opposite to the first surface, a photoelectric conversion section of a second electrically-conductive type embedded in the semiconductor substrate and generating charges corresponding to an amount of light reception by means of photoelectric conversion, a charge-holding section of the second electrically-conductive type embedded in the semiconductor substrate and holding the charges generated in the photoelectric conversion section, a transfer section that transfers the charges from the photoelectric conversion section to a transfer destination, and a trench section extending in a thickness direction from the first surface toward the second surface in the charge-holding section, the trench section including a first base and a first semiconductor layer of the first electrically-conductive type provided to cover the first base.

This application claims the benefit of Japanese Priority Patent Application JP2018-161752 filed with the Japan Patent Office on Aug. 30, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging device comprising:
   a semiconductor substrate of a first electrically-conductive type including a first surface and a second surface on a side opposite to the first surface;
   a photoelectric conversion section of a second electrically-conductive type embedded in the semiconductor substrate and generating charges corresponding to an amount of light reception by means of photoelectric conversion;
   a charge-holding section of the second electrically-conductive type embedded in the semiconductor substrate and holding the charges generated in the photoelectric conversion section;
   a transfer section that transfers the charges from the photoelectric conversion section to a transfer destination;
   a trench section extending in a thickness direction from the first surface toward the second surface in the charge-holding section,
   the trench section including a first base and a first semiconductor layer of the first electrically-conductive type provided to cover the first base; and
   a plate section provided on a bottom surface of the charge-holding section and extending in an in-plane direction orthogonal to the thickness direction,
   wherein the plate section includes a second base, a third semiconductor layer of the first electrically-conductive type provided to cover the second base, and a fourth semiconductor layer of the second electrically-conductive type provided to cover the third semiconductor layer.

2. The imaging device according to claim 1, wherein the trench section further includes a second semiconductor layer of the second electrically-conductive type provided to cover the first semiconductor layer and having an impurity concentration higher than an impurity concentration of the charge-holding section.

3. The imaging device according to claim 1, further comprising a charge-voltage conversion section as the transfer destination to which the charges are transferred from the charge-holding section, wherein
   the trench section further extends in a first direction orthogonal to the thickness direction, and
   the charge-holding section and the charge-voltage conversion section are arranged along the first direction.

4. The imaging device according to claim 3, wherein the photoelectric conversion section and the charge-holding section are arranged along the first direction.

5. The imaging device according to claim 1, wherein the trench section comprises a plurality of trench sections.

6. The imaging device according to claim 5, wherein the trench section of a portion of the plurality of trench sections penetrates the semiconductor substrate from the first surface to the second surface.

7. The imaging device according to claim 1, wherein the transfer section includes a trench gate section provided to be adjacent to the trench section and extending in the thickness direction.

8. The imaging device according to claim 7, wherein
the trench section comprises a plurality of trench sections,
the transfer section includes a plurality of the trench gate sections, and
the plurality of trench sections and the plurality of the trench gate sections are arranged alternately in a direction orthogonal to the thickness direction.

9. The imaging device according to claim 1, wherein the trench section and the plate section are in contact with each other.

10. The imaging device according to claim 1, wherein the trench section is exposed to the first surface.

11. The imaging device according to claim 1, wherein
the semiconductor substrate includes a plurality of pixels, and
the trench section is provided in an element separation section that separates the plurality of pixels from one another.

12. The imaging device according to claim 1, wherein the first semiconductor layer is formed by doping of an impurity from a boundary between the first base and the first semiconductor layer.

13. An imaging device, comprising:
a semiconductor substrate of a first electrically-conductive type including a first surface and a second surface on a side opposite to the first surface;
a photoelectric conversion section of a second electrically-conductive type embedded in the semiconductor substrate and generating charges corresponding to an amount of light reception by means of photoelectric conversion;
a charge-holding section of the second electrically-conductive type embedded in the semiconductor substrate and holding the charges generated in the photoelectric conversion section;
a transfer section that transfers the charges from the photoelectric conversion section to a transfer destination;
a trench section extending in a thickness direction from the first surface toward the second surface in the charge-holding section,
the trench section including a first base and a first semiconductor layer of the first electrically-conductive type provided to cover the first base; and
a plate section extending in an in-plane direction orthogonal to the thickness direction between the photoelectric conversion section and the charge-holding section, wherein
the plate section includes a second base, a third semiconductor layer of the first electrically-conductive type provided to cover the second base, and a fourth semiconductor layer of the second electrically-conductive type provided to cover the third semiconductor layer.

14. The imaging device according to claim 13, wherein the second base in the plate section includes a metal material.

15. An imaging device, comprising:
a semiconductor substrate of a first electrically-conductive type including a first surface and a second surface on a side opposite to the first surface;
a photoelectric conversion section of a second electrically-conductive type embedded in the semiconductor substrate and generating charges corresponding to an amount of light reception by means of photoelectric conversion;
a charge-holding section of the second electrically-conductive type embedded in the semiconductor substrate and holding the charges generated in the photoelectric conversion section;
a transfer section that transfers the charges from the photoelectric conversion section to a transfer destination; and
a trench section extending in a thickness direction from the first surface toward the second surface in the charge-holding section,
the trench section including a first base and a first semiconductor layer of the first electrically-conductive type provided to cover the first base, wherein the trench section further includes a second semiconductor layer of the second electrically-conductive type provided to cover the first semiconductor layer and having an impurity concentration higher than an impurity concentration of the charge-holding section, wherein
the first semiconductor layer comprises a first electrically-conductive type solid-phase diffusion layer, and
the second semiconductor layer comprises a second electrically-conductive type solid-phase diffusion layer.

16. The imaging device according to claim 15, further comprising a plate section provided on a bottom surface of the charge-holding section and extending in an in-plane direction orthogonal to the thickness direction, wherein
the plate section includes a second base, a third semiconductor layer of the first electrically-conductive type provided to cover the second base, and a fourth semiconductor layer of the second electrically-conductive type provided to cover the third semiconductor layer.

* * * * *